United States Patent
Tomita

[19]

[11] Patent Number: 6,145,118
[45] Date of Patent: Nov. 7, 2000

[54] PLOTTING PATTERN DATA PRODUCTION METHOD ELECTRON BEAM PLOTTING METHOD SUBSTRATE WORKING METHOD AND ELECTRON BEAM PLOTTING APPARATUS

[75] Inventor: Manabu Tomita, Kanagawa, Japan

[73] Assignee: Sony Corporation, Tokyo, Japan

[21] Appl. No.: 09/038,817

[22] Filed: Mar. 12, 1998

[30] Foreign Application Priority Data

Mar. 12, 1997 [JP] Japan ..................................... 9-057692

[51] Int. Cl.[7] ............................. G06F 17/50; G06F 17/10; G21K 5/10
[52] U.S. Cl. ......................................... 716/21; 250/492.22
[58] Field of Search ............................ 395/500.2, 500.21, 395/500.22; 250/492.1, 492.22, 492.3; 716/19, 20, 21

[56] References Cited

U.S. PATENT DOCUMENTS

| 5,008,553 | 4/1991 | Abe ..................................... 250/492.2 |
| 5,313,068 | 5/1994 | Meiri et al. ......................... 250/492.22 |
| 5,754,443 | 5/1998 | Manabe ............................... 395/500.22 |
| 5,933,212 | 8/1999 | Kasuga ...................................... 355/20 |

*Primary Examiner*—Paul R. Lintz
*Assistant Examiner*—Leigh Marie Garbowski
*Attorney, Agent, or Firm*—Hill & Simpson

[57] ABSTRACT

The invention provides a plotting pattern data production method suitable for use for production of a mask for exposure or a semiconductor integrated circuit wherein a minimum plotting grid of a magnitude used in an existing apparatus can be used and a semiconductor integrated circuit pattern having a desired size can be formed accurately. The method comprises the steps of: (A) producing an n-fold design pattern by multiplying a design pattern to n times a minimum design pattern unit length (where n>1) and then converting the n-fold design pattern so that profiles thereof may come on those minimum plotting grids adjacent the profiles thereby to obtain a plotting pattern, and (B) (a) setting, for each portion of the plotting pattern which includes any of the profiles of the n-fold design pattern, a dose amount in accordance with a ratio in area of the n-fold design pattern which occupies the minimum plotting grid, but (b) setting a predetermined dose amount for each portion of the plotting pattern which does not include any profile of the n-fold design pattern.

66 Claims, 13 Drawing Sheets

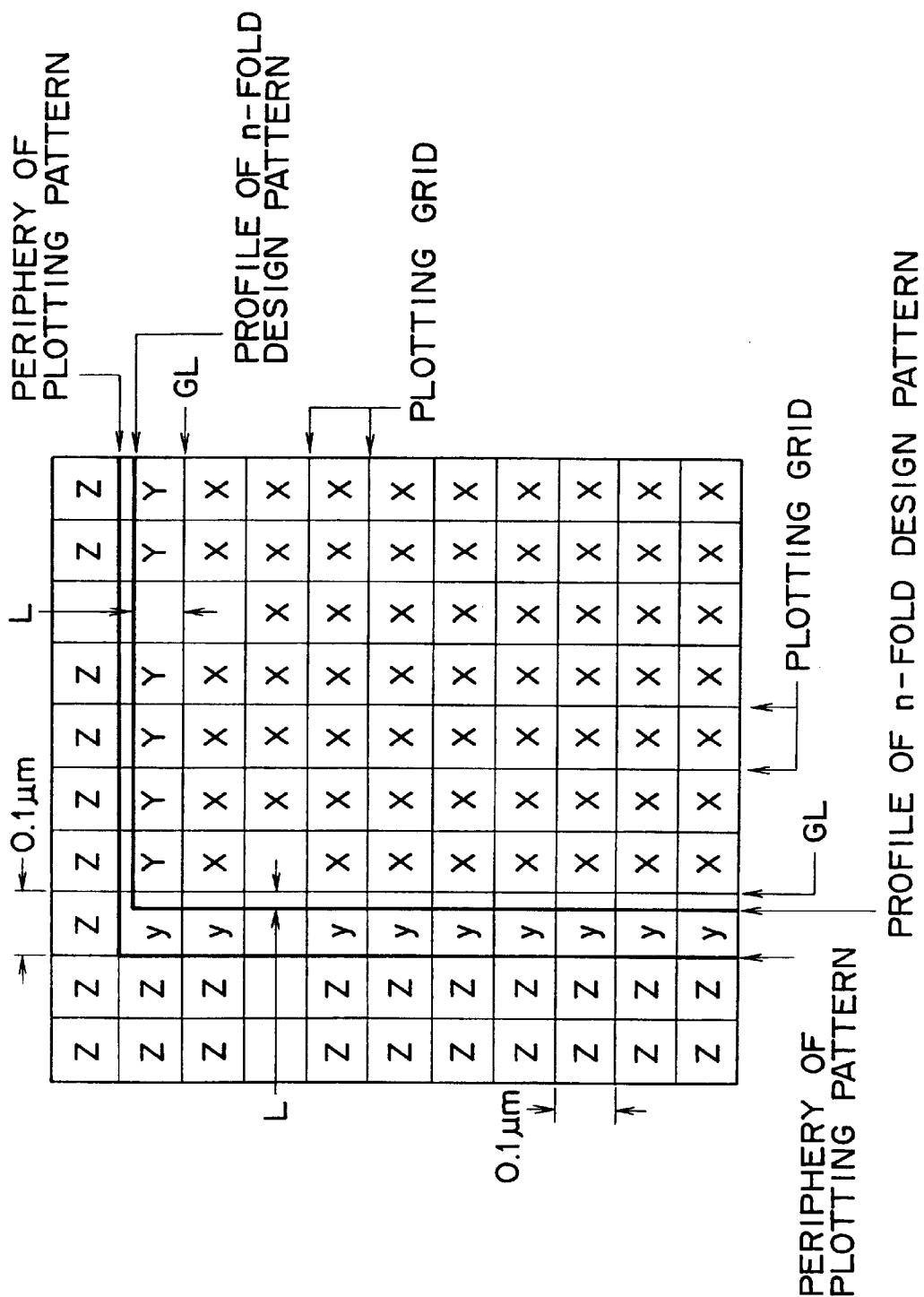

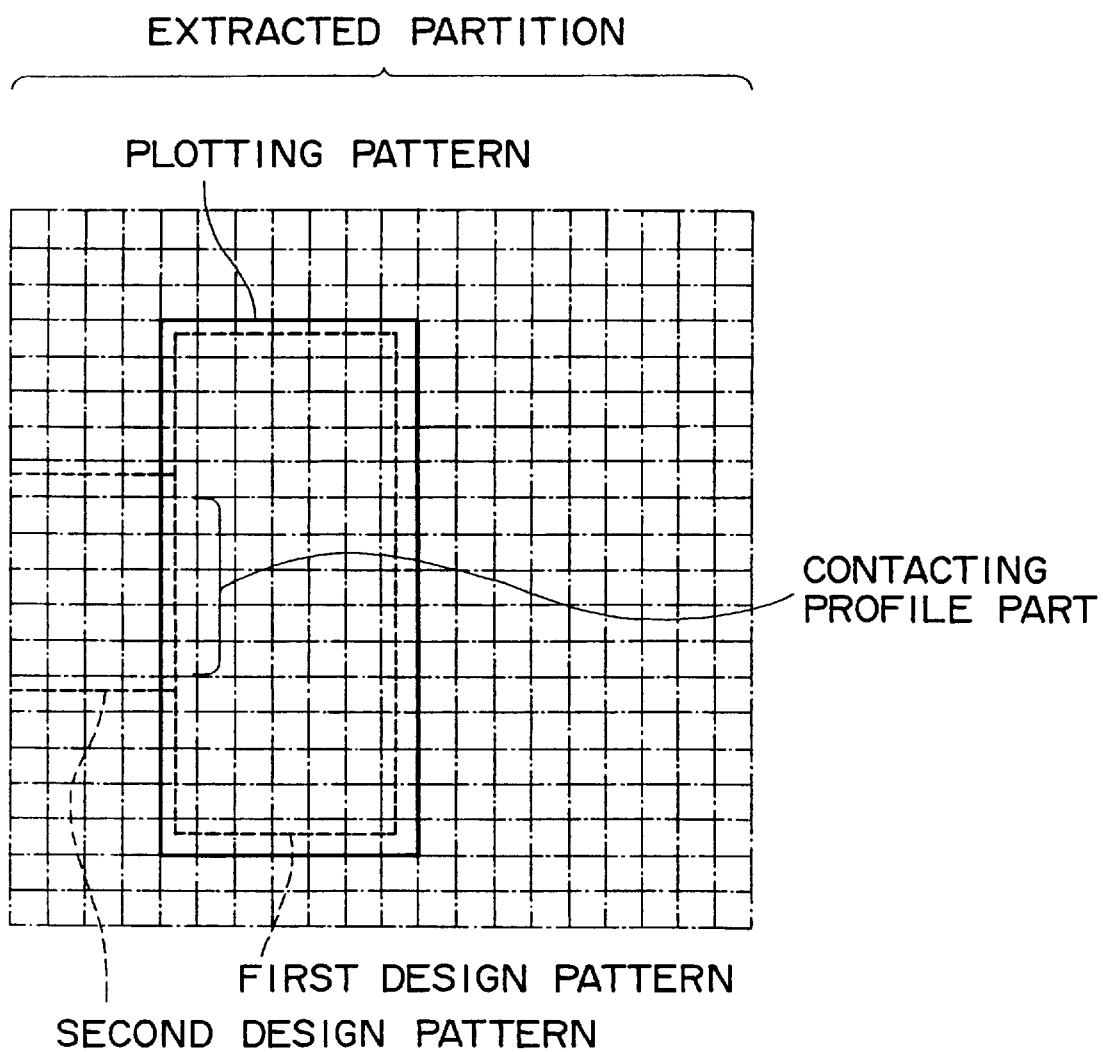

n-FOLD DESIGN PATTERN
(GRAPHIC FORM A)

MINIMUM PLOTTING GRID LENGTH
GRAPHIC FORM C
L
n-FOLD DESIGN PATTERN (GRAPHIC FORM A)
PLOTTING PATTERN (GRAPHIC FORM B)

MINIMUM PLOTTING GRID LENGTH
MINIMUM PLOTTING GRID LENGTH
GRAPHIC FORM D

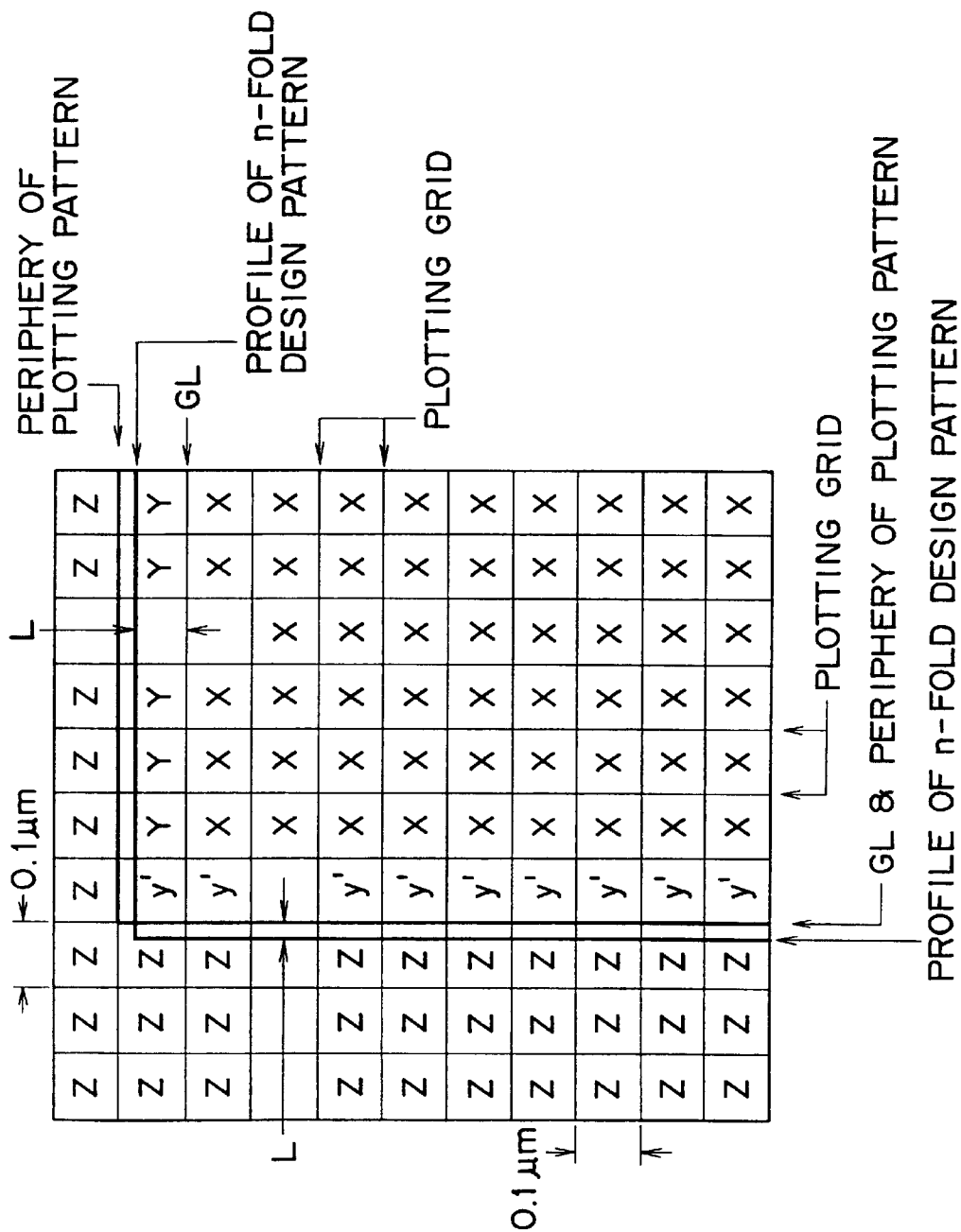

PLOTTING PATTERN DATA PRODUCTION METHOD ELECTRON BEAM PLOTTING METHOD SUBSTRATE WORKING METHOD AND ELECTRON BEAM PLOTTING APPARATUS

BACKGROUND OF THE INVENTION

This invention relates to an electron beam plotting method suitable for production of, for example, a mask for exposure or a semiconductor integrated circuit, a method for producing plotting pattern data for use with such an electron beam plotting method, a substrate working method to which such an electron beam plotting method is applied, and an electron beam plotting apparatus.

Refinement of semiconductor integrated circuits has proceeded in a cycle of approximately 3 years. In order to refine a semiconductor integrated circuit, a pattern for a semiconductor integrated circuit (such a pattern may sometimes be referred to as circuit pattern) must be reduced in scale. Since it requires very much time to try to proceed with designing of a circuit pattern of a reduced scale again from the beginning, a method is adopted very frequently to multiply an existing design circuit pattern by a reduction ratio to reduce the scale of the entire design circuit pattern and make an amendment to each inappropriate portion of the design pattern. This method can provide a higher design efficiency of a circuit pattern. It is to be noted that the amendment to an inappropriate portion of a design circuit pattern may be, for example, where a transistor element has a property different from a desired property, an operation to increase or decrease the width of the design circuit pattern.

For formation of a circuit pattern, a mask for exposure called reticle is normally used. In order to produce a mask for exposure, plotting pattern data is produced based on a design circuit pattern. Then, based on the plotting pattern data, a pattern is plotted on a resist applied to a mask blank using an electron beam. Then, using an etching mask obtained by developing the plotted resist, the mask blank is patterned. By the process, a mask for exposure can be obtained. In a pattern plotting method which employs an electron beam, a raster scanning method or a vector scanning method is normally adopted as a scanning method for a beam, and for the shape of a beam, a variable shaping beam method or a Gaussian beam method is adopted normally. Meanwhile, in order to form a circuit pattern using a mask for exposure, an exposure apparatus of the reduction optical system is used widely. In this instance, a pattern having a size as large as k times that of a design circuit pattern is formed on the mask for exposure. It is to be noted that, in the following description, it is assumed that k=5 for convenience of description.

Also a technique for forming a circuit pattern by a so-called direct electron beam plotting method is known. In the circuit pattern formation technique just mentioned, for example, an electron beam sensitive resist is applied to a processing object layer formed on a semiconductor substrate, and a pattern is plotted on the resist using an electron beam. Then, the processing object layer is patterned using an etching mask obtained by developing the thus plotted resist.

By the way, when it is tried to multiply an existing design circuit pattern by a reduction ratio to reduce the scale of the entire design circuit pattern, a problem that a circuit pattern of an accurately reduced scale cannot be obtained sometimes occurs. For example, the width of a design circuit pattern of a reduced scale when a design circuit pattern of 0.35 $\mu$m wide is reduced by 30% in scale is 0.35×0.7=0.245 $\mu$m. The width of a pattern to be formed on a mask for exposure in order to form a design circuit pattern of the reduced scale is, where k=5, 0.245×5=1.225 $\mu$m. On the other hand, the minimum plotting grid length of an electron beam plotting apparatus used for production of a mask for exposure is, for example, 0.05 $\mu$m. Accordingly, a pattern of 1.225 $\mu$m wide cannot be formed on a mask for exposure, but only a pattern of 1.20 $\mu$m wide (0.24 $\mu$m on a circuit pattern) or 1.25 $\mu$m wide (0.25 $\mu$m on a circuit pattern) can be produced on a mask for exposure. Where a pattern accurately reduced in scale cannot be formed on a mask for exposure in this manner, a large number of inappropriate portions which must be amended are produced on a design circuit pattern.

Further, for example, from a characteristic of a semiconductor integrated device, when it is tried to change the width of a design circuit pattern from 0.30 $\mu$m to 0.31 $\mu$m, the width of the design circuit pattern must be changed without changing the position of the center (center of gravity) of the design circuit pattern. In particular, the positions of the opposite sides of the design circuit pattern are moved outwardly by 0.005 $\mu$m. It is to be noted that, if only one of the opposite sides of a design circuit pattern is moved outwardly by 0.01 $\mu$m, then it is sometimes displaced from a wiring line on an upper layer, resulting in failure in contact with the wiring line. However, where it is tried to move both of the positions of the opposite sides of a design circuit pattern outwardly by 0.05 $\mu$m as described above, the positions of the opposite sides of a pattern to be formed on a mask for exposure must be moved outwardly by 0.025 $\mu$m. However, such processing cannot be performed because the minimum plotting grid length of an electron beam plotting apparatus used for production of a mask for exposure is, for example, 0.05 $\mu$m. After all, the width of the design circuit pattern cannot be avoided to determine to be 0.32 $\mu$m.

As described above, designing of a pattern of an semiconductor integrated circuit is restricted from the magnitude of a minimum plotting grid of an electron beam plotting apparatus for production of a mask for exposure, and such restriction makes a significant obstacle to formation of a desired pattern of a semiconductor integrated circuit. Although this problem can be overcome if the magnitude of a minimum plotting grid of the electron beam plotting apparatus can be made smaller (for example, if the minimum plotting grid length is reduced to 0.001 $\mu$m), an electron beam plotting apparatus of the type just described is very expensive. On the other hand, where, for example, in an electron beam plotting apparatus of the raster scanning type, the magnitude of a minimum plotting grid is reduced to raise the resolution, this gives rise to another problem that an excessively long plotting time is required unless a high blanking frequency is used.

Meanwhile, where, in an electron beam plotting apparatus of the vector scanning type, the magnitude of a minimum plotting grid is reduced, not only is it required to deflect an electron beam accurately in a unit smaller than that of a ordinary electron beam plotting apparatus, but also the position of a stage on which a mask blank is placed must be controlled accurately to cause an electron beam to collide accurately at a desired position of the mask blank. To this end, also the resolution of a detector such as a laser interferometer must be raised accordingly.

Furthermore, if effective figures of plotting pattern data are increased, the size of plotting pattern data may become excessively large, and the amount of plotting pattern data which can be set at a time to the electron beam plotting apparatus is limited. As a result, there is the possibility that plotting pattern data to be used for production of a plurality of masks for exposure may not be set at a time to the electron beam plotting apparatus.

As described above, various difficulties are involved in reduction of the magnitude of a minimum plotting grid of an electron beam plotting apparatus.

SUMMARY OF THE INVENTION

Accordingly, it is an object of the present invention to provide an electron beam plotting method suitable for production of a mask for exposure or a semiconductor integrated circuit wherein the magnitude of a minimum plotting grid of, for example, an existing electron beam plotting apparatus can be used as it is as the magnitude of a minimum plotting grid of an electron beam plotting apparatus and a semiconductor integrated circuit pattern having a desired dimension can be formed accurately, and a method of producing plotting pattern data for use with the electron beam plotting method, a substrate working method to which the electron beam plotting method is applied and an electron beam plotting apparatus.

When plotting, for example, on a resist applied to a mask blank is performed using an electron beam, the electron beam used for plotting passes through the resist and enters the mask blank. Then, the electron beam is scattered over a wide range in the mask blank (that is, so-called back scattering in electron beam lithography occurs), and part of the scattered electron beam enters back the resist again. As a result, the resist is exposed over a much wider range than the incident position of the electron beam thereto. Where the density of plotting patterns is low, the exposure of the resist which arises from back scattering can be ignored. However, where plotting patterns are located close to each other and crowded, since exposure of the resist arising from back scattering occurs over very wide ranges, the stored energy amount in the resist increases beyond a desired stored energy amount, and this may result in a phenomenon that the shape of the resist after development is different from a desired shape. Such a phenomenon as just described is called proximity effect. In a plotting pattern data production method, an electron beam plotting method, a substrate working method and an electron beam plotting apparatus according to some aspects of the present invention described below, proximity effect correction is performed to determine a dose amount taking the influence of back scattering into consideration.

In particular, in order to attain the object described above, according to an aspect of the present invention, there is provided a plotting pattern data production method for producing plotting pattern data used to plot a pattern using an electron beam, comprising the steps of (A) producing an n-fold design pattern by multiplying, where a minimum plotting grid length in plotting with an electron beam is N times a minimum design pattern unit length, N being larger than 1, a design pattern to n times the minimum design pattern unit length, n being larger than 1 but lower smaller than N, and then converting the n-fold design pattern so that profiles thereof may come on those minimum plotting grids adjacent the profiles thereby to obtain a plotting pattern, and (B) (a) setting, for each portion of the plotting pattern which includes any of the profiles of the n-fold design pattern, a doze amount in accordance with a ratio in area of the n-fold design pattern which occupies the minimum plotting grid, but (b) setting a predetermined doze amount for each portion of the plotting pattern which does not include any profile of the n-fold design pattern.

According to another aspect of the present invention, there is provided an electron beam plotting method for plotting a pattern on a processing object using an electron beam based on plotting pattern data produced by the plotting pattern data production method described above. In particular, the electron beam plotting method comprises the single step of plotting a pattern on a processing object using an electron beam based on plotting pattern data composed of dose amounts and a plotting pattern and produced by a plotting pattern data production method which includes the steps of (A) producing an n-fold design pattern by multiplying, where a minimum plotting grid length in plotting with an electron beam is N times a minimum design pattern unit length, N being larger than 1, a design pattern to n times the minimum design pattern unit length, n being larger than 1 but lower smaller than N, and then converting the n-fold design pattern so that profiles thereof may come on those minimum plotting grids adjacent the profiles thereby to obtain a plotting pattern, and (B) (a) setting, for each portion of the plotting pattern which includes any of the profiles of the n-fold design pattern, a doze amount in accordance with a ratio in area of the n-fold design pattern which occupies the minimum plotting grid, but (b) setting a predetermined dose amount for each portion of the plotting pattern which does not include any profile of the n-fold design pattern.

According to a further aspect of the present invention, there is provided a substrate working method for working a substrate using an electron beam plotting method based on plotting pattern data produced by the plotting pattern data production method described above. In particular, the substrate working method comprises the steps of plotting a pattern on a resist applied to a substrate using an electron beam based on plotting pattern data composed of dose amounts and a plotting pattern and produced by a plotting pattern data production method which includes the steps of (A) producing an n-fold design pattern by multiplying, where a minimum plotting grid length in plotting with an electron beam is N times a minimum design pattern unit length, N being larger than 1, a design pattern to n times the minimum design pattern unit length, n being larger than 1 but lower smaller than N, and then converting the n-fold design pattern so that profiles thereof may come on those minimum plotting grids adjacent the profiles thereby to obtain a plotting pattern, and (B) (a) setting, for each portion of the plotting pattern which includes any of the profiles of the n-fold design pattern, a doze amount in accordance with a ratio in area of the n-fold design pattern which occupies the minimum plotting grid, but (b) setting a predetermined dose amount for each portion of the plotting pattern which does not include any profile of the n-fold design pattern, and developing the plotted resist to produce an etching mask and patterning the substrate using the etching mask.

In the plotting pattern data production method, electron beam plotting method or substrate working method described above, in the step (A), the n-fold design pattern may be converted so that the profiles thereof may come on those minimum plotting grids which are most adjacent the profiles. Or, the n-fold design pattern may be converted so that a size of the plotting pattern may be equal to or larger than the n-fold design pattern. In this instance, the dose amount set in (a) of the step (B) must be equal to or smaller than the predetermined dose amount set in (b) of the step (B), and further, preferably in (a) of the step (B), the dose amount is set among different stages in accordance with a ratio in area of the n-fold design pattern which occupies the minimum plotting grid. Or else, in the step (A), the n-fold design pattern may be converted so that a size of the plotting pattern may be equal to or smaller than the n-fold design pattern. In this instance, the dose amount set in (a) of the step (B) must be equal to or larger than the predetermined dose amount set in (b) of the step (B), and further, preferably in (a) of the step (B), the dose amount is set among different stages in accordance with a ratio in area of the n-fold design pattern which occupies the minimum plotting grid.

According to a still further aspect of the present invention, there is provided a plotting pattern data production method for producing plotting pattern data used to plot a pattern using an electron beam, comprising the steps of (A) producing an n-fold design pattern by multiplying, where a minimum plotting grid length in plotting with an electron beam is N times a minimum design pattern unit length, N being larger than 1, a design pattern to n times the minimum design pattern unit length, n being larger than 1 but lower smaller than N, and then converting the n-fold design pattern so that profiles thereof may come on those minimum plotting grids adjacent the profiles thereby to obtain a plotting pattern, and (B) (a) setting evaluation points at predetermined positions of the profiles of the n-fold design pattern and solving a stored energy balance equation set up at each of the evaluation points to determine a dose amount at each portion of the plotting pattern which includes any of the profiles of the n-fold design pattern, but (b) setting a predetermined dose amount for each portion of the plotting pattern which does not include any profile of the n-fold design pattern.

According to a yet further aspect of the present invention, there is provided an electron beam plotting method for plotting a pattern on a processing object using an electron beam based on plotting pattern data produced by the plotting pattern data production method described above. In particular, the electron beam plotting method comprises the single step of plotting a pattern on a processing object using an electron beam based on plotting pattern data composed of dose amounts and a plotting pattern and produced by a plotting pattern data production method which includes the steps of (A) producing an n-fold design pattern by multiplying, where a minimum plotting grid length in plotting with an electron beam is N times a minimum design pattern unit length, N being larger than 1, a design pattern to n times the minimum design pattern unit length, n being larger than 1 but lower smaller than N, and then converting the n-fold design pattern so that profiles thereof may come on those minimum plotting grids adjacent the profiles thereby to obtain a plotting pattern, and (B) (a) setting evaluation points at predetermined positions of the profiles of the n-fold design pattern and solving a stored energy balance equation set up at each of the evaluation points to determine a dose amount at each portion of the plotting pattern which includes any of the profiles of the n-fold design pattern, but (b) setting a predetermined dose amount for each portion of the plotting pattern which does not include any profile of the n-fold design pattern.

According to a yet further aspect of the present invention, there is provided a substrate working method for working a substrate using an electron beam plotting method based on plotting pattern data produced by the plotting pattern data production method described above. In particular, the substrate working method comprises the steps of plotting a pattern on a resist applied to a substrate using an electron beam based on plotting pattern data composed of dose amounts and a plotting pattern and produced by a plotting pattern data production method which includes the steps of (A) producing an n-fold design pattern by multiplying, where a minimum plotting grid length in plotting with an electron beam is N times a minimum design pattern unit length, N being larger than 1, a design pattern to n times the minimum design pattern unit length, n being larger than 1 but lower smaller than N, and then converting the n-fold design pattern so that profiles thereof may come on those minimum plotting grids adjacent the profiles thereby to obtain a plotting pattern, and (B) (a) setting evaluation points at predetermined positions of the profiles of the n-fold design pattern and solving a stored energy balance equation set up at each of the evaluation points to determine a dose amount at each portion of the plotting pattern which includes any of the profiles of the n-fold design pattern, but (b) setting a predetermined dose amount for each portion of the plotting pattern which does not include any profile of the n-fold design pattern, and developing the plotted resist to produce an etching mask and patterning the substrate using the etching mask.

In the plotting pattern data production method, electron beam plotting method or substrate working method described above, the entire n-fold design pattern is partitioned into predetermined regions, and where positions of the evaluation points $E_i$ where i=1, 2, ..., m are represented by $EP_j$, dose amounts at those portions of the plotting pattern which include the profiles in which the evaluation points $E_j$, where j=1, 2, ..., m, of the n-fold design pattern are included, to be determined in (a) of the step (B) are represented by $D_j$ and the portions of the plotting pattern are represented by $AP_j$, the predetermined dose amount in (b) of the step (B) is represented by $D_0$ and the portion of the plotting pattern which does not include any profile of the n-fold design pattern is represented by $AP_0$, dose amounts at eight regions around a region which includes the n-fold design pattern in which the evaluation points $E_i$ are included are represented by $d_k$ where k=1, 2, ..., 8 and the eight regions are represented by $ap_k$, a stored energy threshold value is represented by $E_{th}$, an EID function is represented by f(r), and a back scattering coefficient of the EID function is represented by $\eta$ and a forward scattering radius of the EID function is represented by $\beta_f$ while a back scattering radius of the EID function is represented by $\beta_b$, the stored energy balance equation is given by the following expression (1):

$$\sum_{j=1}^{m} D_j \int_{r \in AP_j} f(r - EP_i) dr +$$

$$D_0 \int_{r \in AP_0} f(r - EP_i) dr + \sum_{k=1}^{8} d_k \int_{r \in ap_k} f(r - EP_i)_i dr = E_{th}$$

$$\text{where } f(r) = \frac{1}{\pi(1+\eta)} \frac{1}{\beta_f^2} \exp{-\frac{r^2}{\beta_f^2}} + \frac{\eta}{\beta_b^2} \exp{-\frac{r^2}{\beta_b^2}}$$

In the plotting pattern data production method, electron beam plotting method or substrate working method described above, in the step (A), the n-fold design pattern may be converted so that the profiles thereof may come on those minimum plotting grids which are most adjacent the profiles. Or, the n-fold design pattern may be converted so that a size of the plotting pattern may be equal to or larger than the n-fold design pattern, or the n-fold design pattern may be converted so that a size of the plotting pattern may be equal to or smaller than the n-fold design pattern.

In any of the plotting pattern data production methods, electron beam plotting methods and substrate working methods described above, where a first n-fold design pattern and a second n-fold design pattern are in contact with each other, the predetermined dose amount should be set for a portion of the plotting pattern which includes a portion of a profile of the first n-fold design pattern at which the first n-fold design pattern is in contact with th e second n-fold design pattern.

In any of the plotting pattern data production methods, electron beam plotting methods and substrate working methods described above, an object of plotting of a pattern performed using an electron beam or the processing object may be a resist of the positive type or the negative type applied to a mask blank for production of a mask for exposure to be used for formation of a pattern of a semiconductor integrated circuit or may be a resist of the positive type or the negative type to be used for formation of a pattern of a semiconductor integrated circuit.

In any of the substrate working methods described above, the substrate may be, for example, a mask blank, a semiconductor substrate or a processing object layer formed on a semiconductor substrate. The mask blank may be formed, for example, from a light intercepting thin layer or layers or a light partially intercepting thin layer or layers of a metal or a metal oxide formed on a glass substrate such as sodium lime glass, heat resistance glass or synthetic quartz glass. In this instance, the mask for exposure produced by patterning the substrate may be, for example, an ordinary mask for exposure on which a pattern formed from a light intercepting thin film is formed, a phase shift mask, or a phase sift mask of the half tone type on which a pattern formed from a light partially intercepting thin film is formed. Meanwhile, the processing object layer may particularly be, for example, a polycrystalline silicon layer in which an impurity is doped, a metal layer of an aluminum alloy, tungsten, copper, silver or the like, a metal compound layer of tungsten silicide, titanium silicide or the like, a layer structure of a polycrystalline silicon layer in which an impurity is doped, a metal compound layer of tungsten silicide, titanium silicide or the like and an insulating layer, or an insulating layer. Here, for the insulating layer, a known insulating material such as, for example, $SiO_2$, PBSG, PSG, BSG, AsSG, SbSG, NSG, SOG, LTO (Low Temperature Oxide, low temperature $CVD-SiO_2$), SiN, SiON or the like or a layer structure of any of the insulating materials can be employed.

In the substrate working methods described above, in order to inspect the pattern formed on the substrate, preferably the pattern formed on the substrate and the design pattern are compared with each other.

According to a yet further aspect of the present invention, there is provided an electron beam plotting apparatus, comprising design pattern data storage means in which data of a design pattern are stored, design pattern data division means for dividing the data of the design pattern into data of a predetermined size, first storage means for storing the divided data of the design pattern, plotting pattern data production means for producing plotting pattern data based on the divided data of the design pattern stored in the first storage means, second storage means for storing the produced plotting pattern data, and electron beam plotting means, the plotting pattern data production means being operable, based on the divided data of the design pattern, to (A) produce an n-fold design pattern by multiplying, where a minimum plotting grid length in plotting with an electron beam is N times a minimum design pattern unit length, N being larger than 1, the design pattern to n times the minimum design pattern unit length, n being larger than 1 but lower smaller than N, and then convert the n-fold design pattern so that profiles thereof may come on those minimum plotting grids adjacent the profiles thereby to obtain a plotting pattern and (B) (a) set, for each portion of the plotting pattern which includes any of the profiles of the n-fold design pattern, a dose amount in accordance with a ratio in area of the n-fold design pattern which occupies the minimum plotting grid, but (b) set a predetermined doze amount for each portion of the plotting pattern which does not include any profile of the n-fold design pattern.

In the electron beam plotting apparatus, the plotting pattern data production means may convert, in the step (A), the n-fold design pattern so that the profiles thereof may come on those minimum plotting grids which are most adjacent the profiles. Or, the n-fold design pattern may be converted so that a size of the plotting pattern may be equal to or larger than the n-fold design pattern. In this instance, the plotting pattern data production means must set, in (a) of the step (B), the dose amount equal to or smaller than the predetermined dose amount set in (b) of the step (B), and further, preferably the plotting pattern data production means sets, in (a) of the step (B), the dose amount among different stages in accordance with a ratio in area of the n-fold design pattern which occupies the minimum plotting grid. Or else, the plotting pattern data production means may convert, in the step (A), the n-fold design pattern so that a size of the plotting pattern may be equal to or smaller than the n-fold design pattern. In this instance, the plotting pattern data production means must set, in (a) of the step (B), the dose amount equal to or larger than the predetermined dose amount set in (b) of the step (B), and further, preferably the plotting pattern data production means sets, in (a) of the step (B), the dose amount among different stages in accordance with a ratio in area of the n-fold design pattern which occupies the minimum plotting grid.

According to a yet further aspect of the present invention, there is provided an electron beam plotting apparatus, comprising design pattern data storage means in which data of a design pattern are stored, design pattern data division means for dividing the data of the design pattern into data of a predetermined size, first storage means for storing the divided data of the design pattern, plotting pattern data production means for producing plotting pattern data based on the divided data of the design pattern stored in the first storage means, second storage means for storing the produced plotting pattern data, and electron beam plotting means, the plotting pattern data production means being operable, based on the divided data of the design pattern, to (A) produce an n-fold design pattern by multiplying, where a minimum plotting grid length in plotting with an electron beam is N times a minimum design pattern unit length, N being larger than 1, the design pattern to n times the minimum design pattern unit length, n being larger than 1 but lower smaller than N, and then convert the n-fold design pattern so that profiles thereof may come on those minimum plotting grids adjacent the profiles thereby to obtain a plotting pattern, and (B) (a) set evaluation points at predetermined positions of the profiles of the n-fold design pattern and solving a stored energy balance equation set up at each of the evaluation points to determine a dose amount at each portion of the plotting pattern which includes any of the profiles of the n-fold design pattern, but (b) set a predetermined dose amount for each portion of the plotting pattern which does not include any profile of the n-fold design pattern.

The electron beam plotting apparatus may be constructed such that the plotting pattern data production means partitions the entire n-fold design pattern into predetermined regions, and where positions of the evaluation points $E_i$ where i=1, 2, . . . , m are represented by $EP_i$, dose amounts at those portions of the plotting pattern which include the profiles in which the evaluation points $E_j$, where j=1, 2, . . . , m, of the n-fold design pattern are included, to be determined in (a) of the step (B) are represented by $D_j$ and the portions of the plotting pattern are represented by $AP_j$, the predetermined dose amount in (b) of the step (B) is represented by Do and the portion of the plotting pattern which does not include any profile of the n-fold design pattern is represented by $AP_0$, dose amounts at eight regions around a region which includes the n-fold design pattern in which the evaluation points $E_i$ are included are represented by $d_k$ where k=1, 2, . . . , 8 and the eight regions are represented by $ap_k$, a stored energy threshold value is represented by $E_{th}$, an EID function is represented by f(r), and a back scattering coefficient of the EID function is represented by η and a forward scattering radius of the EID function is represented by $β_f$ while a back scattering radius of the EID function is represented by $β_b$, the stored energy balance equation is given by the following expression (1):

$$\sum_{j=1}^{m} D_j \int_{r \in AP_j} f(r - EP_i) dr + \\ D_0 \int_{r \in AP_0} f(r - EP_i) dr + \sum_{k=1}^{8} d_k \int_{r \in ap_k} f(r - EP_i) dr = E_{th} \\ \text{where } f(r) = \frac{1}{\pi(1+\eta)} \left[ \frac{1}{\beta_f^2} \exp - \frac{r^2}{\beta_f^2} + \frac{\eta}{\beta_b^2} \exp - \frac{r^2}{\beta_b^2} \right] \tag{1}$$

In the electron beam plotting apparatus, the plotting pattern data production means may convert, in the step (A), the n-fold design pattern so that the profiles thereof may come on those minimum plotting grids which are most adjacent the profiles. Or, the n-fold design pattern may be converted so that a size of the plotting pattern may be equal to or larger than the n-fold design pattern or may be converted so that a size of the plotting pattern may be equal to or smaller than the n-fold design pattern.

In the electron beam plotting apparatus, where a first n-fold design pattern and a second n-fold design pattern are in contact with each other, preferably the plotting pattern data production means sets the predetermined dose amount for a portion of the plotting pattern which includes a portion of a profile of the first n-fold design pattern at which the first n-fold design pattern is in contact with the second n-fold design pattern.

In the present invention, an n-fold design pattern is converted so that profiles thereof may come on those minimum plotting grids which are adjacent the profiles to obtain a plotting pattern, and for portions of the plotting pattern which include the profiles of the n-fold design pattern, dose amounts are set in accordance with ratios in area of the n-fold design pattern which occupy the minimum plotting grids. Or, evaluation points are set at predetermined positions of the profiles of the n-fold design pattern, and stored energy balance equations set up at the evaluation points are solved to determine dose amounts at the portions of the plotting pattern which include the profiles of the n-fold design pattern. Therefore, for example, a pattern having a desired size can be formed accurately on a mask for exposure or a semiconductor integrated circuit pattern having a desired size can be formed accurately while the size of a minimum plotting grid of the electron beam plotting apparatus (or upon plotting) is kept equal to the size of a minimum plotting grid of an existing electron beam plotting apparatus (or upon plotting).

In particular, even if plotting pattern data are produced based on a design pattern produced in a unit smaller than the minimum plotting grid length of the electron beam plotting apparatus (or upon plotting) in order to allow incrementing or decrementing of a shrink or a pattern of a semiconductor integrated circuit to be performed readily, by controlling doze amounts at portions of the plotting pattern which correspond to the profiles of the n-fold design pattern to suitable values, a pattern having a shape as defined by the design pattern can be formed accurately and readily on a subject or a processing object on which a pattern is to be plotted using an electron beam. Besides, an increase in design pattern data is not invited, and the plotting time of a pattern with an electron beam is not increased either.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 1 is a diagrammatic view schematically illustrating a relationship in arrangement between an n-fold design pattern and minimum plotting grids according to Example 1 of the present invention;

FIGS. 6, 7 and 8A to 8C are diagrammatic views schematically illustrating operation of a graphic form according to Example 1;

FIGS. 10 and 11 are diagrammatic views schematically illustrating relationships in arrangement between an n-fold design pattern and minimum plotting grids in Example 2 of the present invention;

DESCRIPTION OF THE PREFERRED EMBODIMENTS

EXAMPLE 1

Example 1 relates to a plotting pattern data production method, an electron beam plotting method, a substrate working method and an electron beam plotting apparatus according to a first embodiment of the present invention. In the plotting pattern data production method of Example 1, the minimum plotting grid length in plotting with an electron beam was set to 0.1 μm, and the minimum design pattern unit length was set to 0.005 μm. Consequently, N=20. Further, an n-fold design pattern was determined by multiplying a design pattern to 5 (=n) times the minimum design pattern unit length. Then, a plotting pattern was obtained by converting the n-fold design pattern so that the profiles of the n-fold design pattern might come on those minimum plotting grids which were adjacent the profiles. In particular, in Example 1, the n-fold design pattern is converted so that the magnitude of the plotting pattern may be equal to or larger than the magnitude of the n-fold design pattern. In other words, the n-fold design pattern was converted so that the profiles thereof might come on those minimum plotting grids which were positioned on the outer side adjacent the profiles. It is to be noted that the values of N and n are not limited to the specific values given above.

FIG. 1 schematically illustrates a relationship in arrangement between an n-fold design pattern (only part of which is shown) and minimum plotting grids. Each minimum plotting grid denoted by "X" indicates a portion of the plotting pattern which does not include a profile of the n-fold design pattern, and each minimum plotting grid denoted by "Y" or "y" indicates a portion of the plotting pattern which includes a profile of the n-fold design pattern. Meanwhile, each minimum plotting grid denoted by "Z" indicates a minimum plotting grid which does not include the n-fold design pattern. In other words, no plotting is performed for each minimum plotting grid which is denoted by "Z".

Figure 2A:
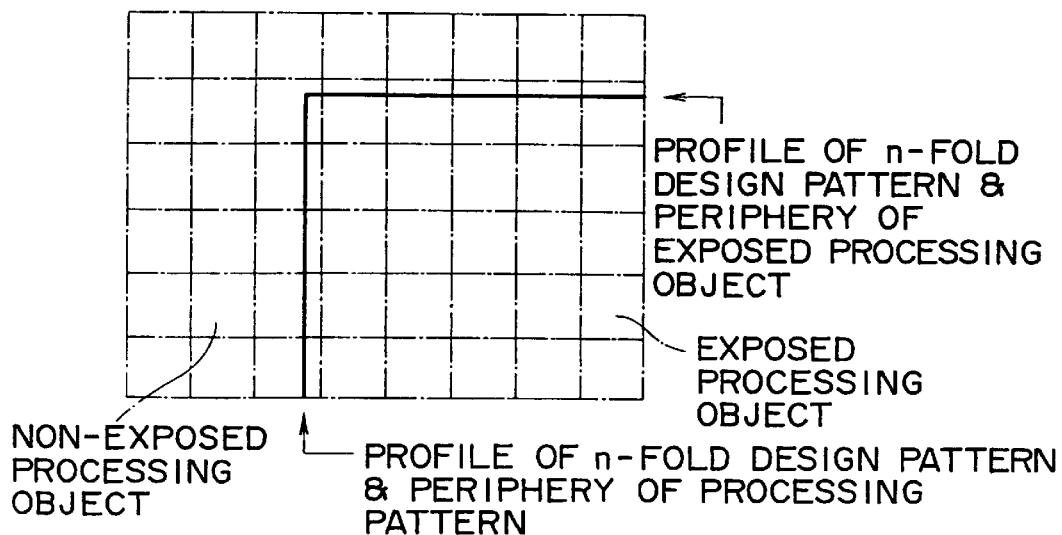
FIGS. 2A and 2B are diagrammatic views schematically illustrating outer edges of a processing object exposed according to Example 1.
Figure 2B:
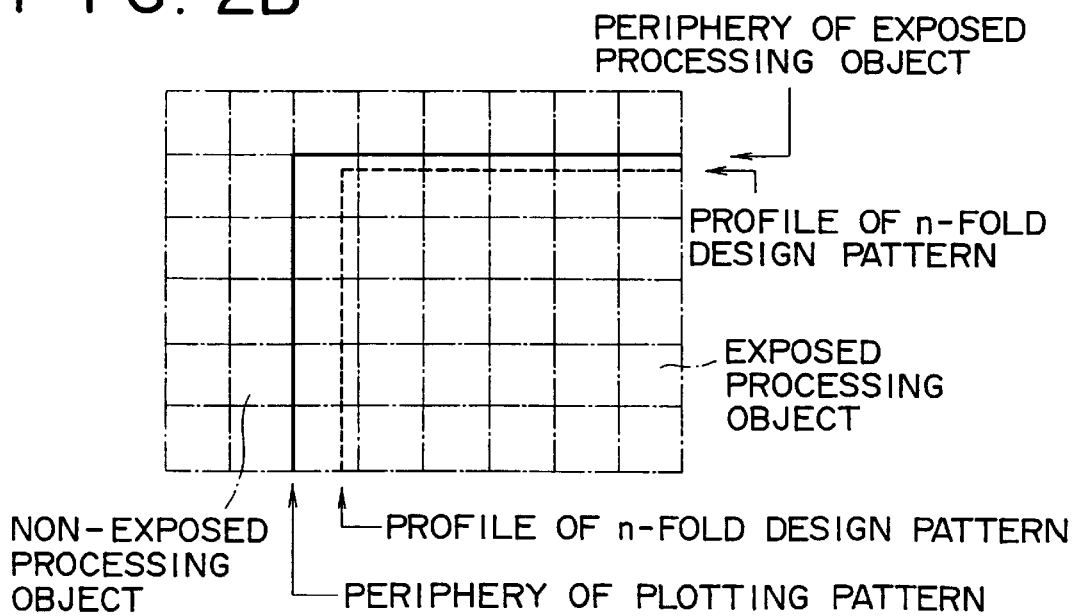

If plotting is performed with an equal predetermined dose amount $D_0$ for the minimum plotting grids "X" at portions of the plotting pattern which do not include the profiles of the n-fold design pattern and the minimum plotting grids "Y" and "y" at portions of the plotting pattern which include the profiles of the n-fold design pattern, then a pattern of a size different from the size of the design pattern is finally formed on the processing object as seen in FIG. 2B. It is to be noted that, in FIG. 2B, in order to facilitate understanding, minimum plotting grids are indicated by alternate long and short dash lines and the profiles of the n-fold design pattern are indicated by broken lines, and the outer edges of the exposed processing object are indicated by solid lines.

Accordingly, in Example 1, for those portions of the plotting pattern which include the n-fold design pattern (for a set of the minimum plotting grids "Y" and "y"), dose amounts corresponding to ratios in area of the n-fold design pattern which occupies the minimum plotting grids. More particularly, referring to FIG. 1, dose amounts DOL are set corresponding to the distances L from most outside plotting grid lines GL at those portions of the plotting pattern which do not include the profiles of the n-fold design pattern to the profiles of the n-fold design pattern which occupy the minimum plotting grids. In Example 1, the dose amounts are set among four stages based on the ratios in area (distance L) of the n-fold design pattern which occupies the minimum plotting grids. It is to be noted that, while it is arbitrary among which number of stages each dose amount should be set, preferably it should be set, for example, among N/n stages. While, in Example 1, the relationship between the distances L and the dose amounts $D_{OL}$ is set in such a manner as illustrated in Table 1 given below, the relationship between them is not limited to the specific relationship illustrated in Table 1. Further, while the relationship between the dose amounts $D_{OL}$ and the shot ranks are given below, the dose amounts $D_{OL}$ is equal to or smaller than the predetermined dose amount $D_0$ (standard dose amount=3 $\mu C/cm^2$). Further, while it is determined that a corner portion of the profiles of the n-fold design pattern is included in a longer one of the profiles of the n-fold design pattern, also such an operation is arbitrary.

$$D_{OL} = \{(\text{initial value}) + (\text{step}) \times (\text{shot rank})\} \times$$

$$(\text{standard dose amount})$$

$$= \{0.1 + 0.05 \times (\text{shot rank})\} \times 3(\mu C/cm^2)$$

TABLE 1

| L ($\mu$m)     | Shot Rank | Dose Amount ($D_{OL}$) |
|----------------|-----------|------------------------|
| $L_0 = 0.000$  | 0         | $D_0$ *                |
| $L_1 = 0.025$  | 4         | $D_{OL\_1}$            |
| $L_2 = 0.050$  | 10        | $D_{OL\_2}$            |
| $L_3 = 0.750$  | 14        | $D_{OL\_3}$            |

*: Standard dose amount

Meanwhile, the predetermined doze amount $D_0$ (standard dose amount) is set for those portions (a set of the minimum plotting grids "X") of the plotting pattern which do not include any profile of the n-fold design pattern.

Based on the plotting pattern data produced in this manner and including the dose amounts and the plotting pattern, a pattern was plotted on the processing object using an electron beam (refer to the diagrammatic view of FIG. 2A). More particularly, in Example 1, the processing object was set to a resist applied to the mask blank (which corresponds to a substrate) for production of a mask for exposure to be used for pattern formation of a semiconductor integrated circuit. It is to be noted that, if plotting is performed, for those portions (the set of minimum plotting grids "Y" and "y") of the plotting pattern which include the profiles of the n-fold design pattern, with dose amounts set in accordance with the ratios in area (distance L) of the n-fold plotting design pattern which occupies the minimum plotting grids, then because of an influence of back scattering upon plotting with an electron beam at those positions of the plotting pattern which do not include the profiles of the n-fold design pattern, a plotting pattern which extends to a portion of the plotting pattern which does not include any profile of the n-fold design pattern to a minimum plotting grid which includes a profile of the n-fold design pattern is formed. It is to be noted that the dose amount can be controlled accurately by the current value for the electron beam and the irradiation time of the electron beam. Accordingly, if the dose amount is controlled accurately in accordance with the sensitivity of the resist, then a plotting pattern having a desired shape can be obtained.

Then, using an etching mask obtained by developing the thus plotted resist, the mask blank serving as a substrate was patterned to produce a mask for exposure. In Example 1, an electron beam plotting apparatus of the raster scanning type of a spot electron beam was used for the electron beam plotting apparatus. In an electron beam plotting apparatus of the type mentioned, the dose amount cannot be varied in minimum plotting grid units. Therefore, in Example 1, plotting was performed four times. In particular, four files (called job files) of plotting pattern data based on the four stages of dose amounts of $D_0$, $D_{OL\_1}$, $D_{OL\_2}$ and $D_{OL_3}$ were produced. Those job files are composed of dose amounts and coordinate values of the plotting pattern. Then, using those job files, plotting of a pattern with an electron beam was successively performed based on the raster scanning method. Then, a mask for exposure was produced based on a known production process for a mask for exposure.

In order to perform inspection of the pattern formed on the mask for exposure which corresponds to a substrate, comparison between the pattern formed on the obtained mask for exposure and the design pattern was performed using an inspection apparatus which includes a line sensor. The comparison revealed that the two patterns (particularly at the profiles) exhibit good coincidence therebetween. In particular, in Example 1, a pattern can be formed in units of 0.025 μm on a mask for exposure and the resolution in an electron beam plotting method is improved by four times. It is to be noted that comparison between the pattern formed on the mask for exposure obtained and plotting pattern data does not make accurate comparison because some displacement is present between the plotting pattern of the plotting pattern data and the design pattern, and consequently, only an inspection result that the pattern formed on the mask for exposure is an unacceptable pattern is obtained.

For comparison, another mask for exposure was produced using an ordinary method. In particular, plotting was performed with the equal predetermined dose amount $D_0$ for both of the set of minimum plotting grids "X" in those portion of the plotting pattern which do not include the profiles of the n-fold design pattern and the set of minimum plotting grids "Y" and "y" of the plotting pattern which include the profiles of the n-fold design pattern. Then, comparison between the pattern formed on the mask pattern for exposure obtained and the design pattern was performed using the inspection apparatus which includes the line sensor. The comparison revealed that a displacement appears between the two patterns (particularly at the profiles).

It is to be noted that, while, in Example 1, an electron beam plotting apparatus of the raster scanning type was used, the applicable electron beam plotting apparatus is not limited to an apparatus of the specific type, and an electron beam plotting apparatus of the vector scanning type or of the variable shaping beam type may be used instead. Where an electron beam plotting apparatus wherein the dose amount can be varied for each plotting unit of a pattern is used, a pattern can be plotted on a processing object by a single plotting operation. Further, where an electron beam plotting apparatus wherein a number of regions as large as a plurality of times a minimum plotting grid can be plotted at a time is used, the unit region in plotting is not limited to a minimum plotting grid. Further, any one of a positive resist and a negative resist can be used.

Details of operation for obtaining plotting pattern data in Example 1 are described below with reference to the flow charts of FIGS. 3 to 5 and FIGS. 6, 7 and 8A to 8C which illustrate a concept of operation of a graphic form. It is to be noted that, since operation of a graphic form can be converted into coordinate values readily on a computer program, detailed description of operation of a computer are omitted herein.

Figure 6:
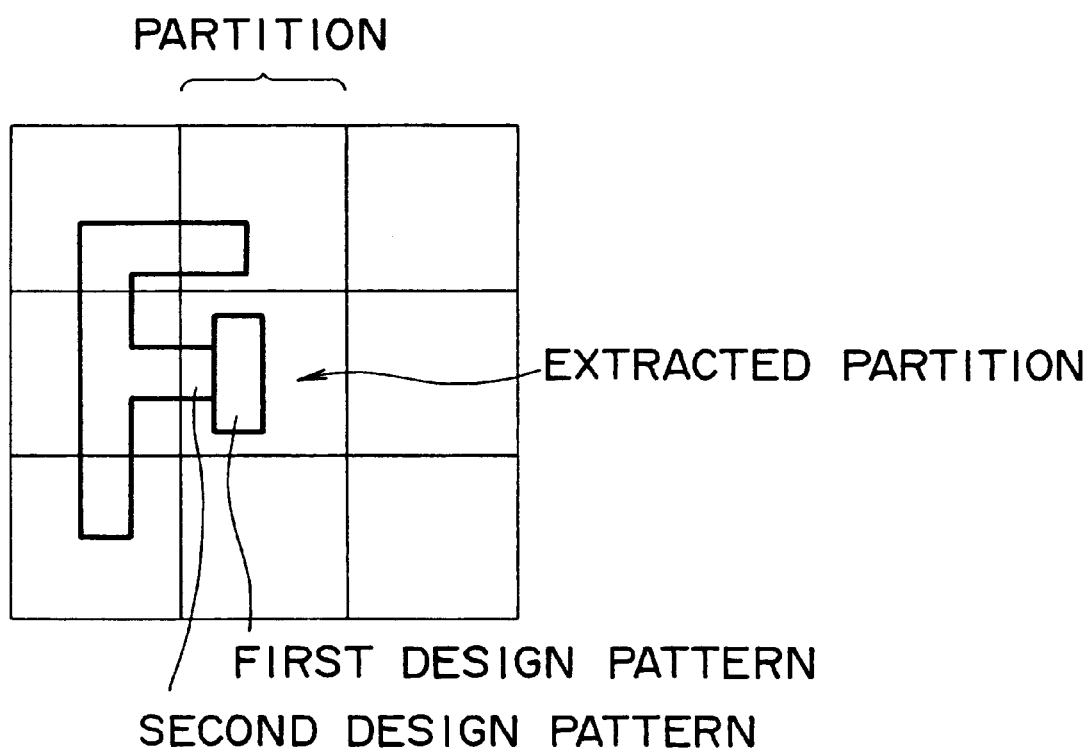
Figure 8A:
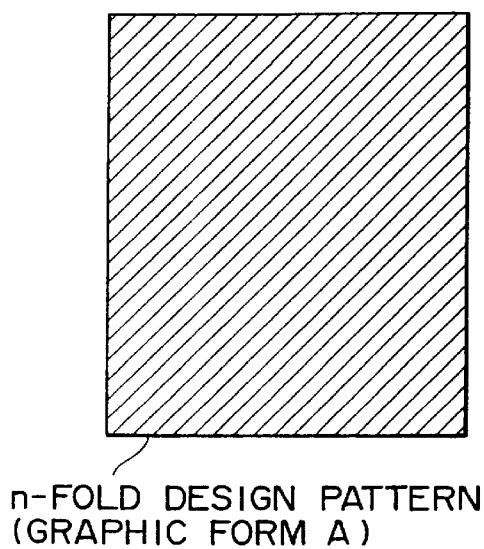
Figure 8B:
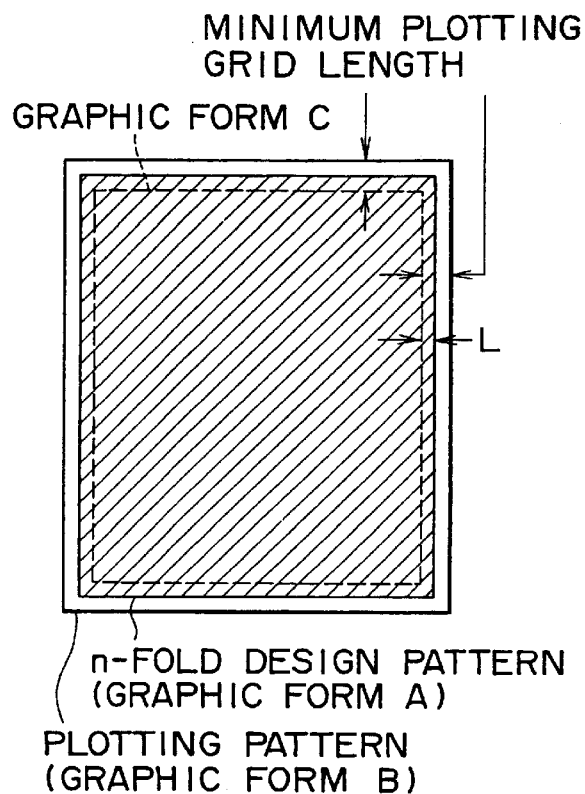
Figure 8C:
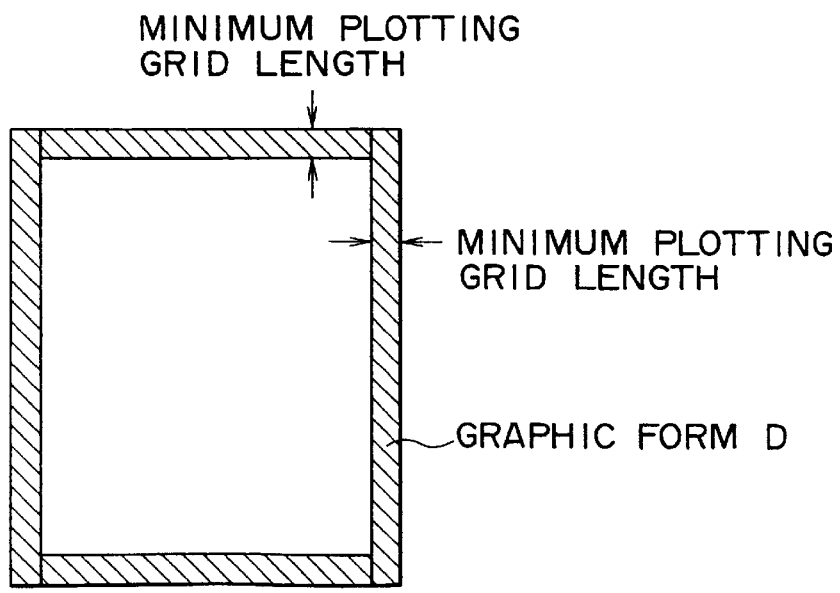

First, an entire design pattern is partitioned into partitions of a predetermined size (S-100). Then, one of the partitions is extracted or sampled out (S-101), and one of design patterns in the extracted partition is extracted (the thus extracted design pattern is hereinafter referred to as selected design pattern) (S-102). This condition is schematically illustrated in FIG. 6. Then, one of profiles (sides) of the selected design pattern is aimed at (S-103), and it is checked whether or not the aimed profile of the selected design pattern is in contact with another design pattern (S-104). In other words, it is checked whether or not the first n-fold design pattern (one design pattern) is in contact with the second n-fold design pattern (another design pattern).

If the aimed profile of the selected design pattern is not in contact with another design pattern, then an n-fold design pattern is determined by multiplying the design pattern to n times (in Example 1, to 5 times) the minimum design pattern unit length (in Example 1, 0.005 μm) using a conversion program while maintaining the grids upon pattern designing (S-110). The n-fold design pattern obtained is referred to as graphic pattern A (refer to FIG. 8A). It is to be noted that the graphic form A is shown with slanting lines in FIGS. 8A and 8B. Then, based on the graphic form A, the n-fold design pattern is converted using a conversion program so that the profile thereof may come on minimum plotting grids adjacent the profile (S-111) thereby to obtain a plotting pattern. The plotting pattern obtained is referred to as graphic for B (refer to FIG. 8B). It is to be noted that, in Example 1, the n-fold design pattern is converted so that the size thereof may be equal to or larger than the size of the n-fold design pattern. In other words, the n-fold design pattern is converted so that the profile thereof may come on minimum plotting grids on the outer side adjacent the profile. Thereafter, a graphic form C (refer to FIG. 8B) having a profile which is positioned on the inner side by one minimum plotting grid length from the profile of the graphic form B (S-112). It is to be noted that the graphic form C is indicated by a broken line in FIG. 8B.

Then, the graphic form C is subtracted from the graphic form B to obtain a graphic form D (refer to FIG. 8C) (S-113). This graphic form D corresponds to the portion of the plotting pattern which includes the profile of the n-fold design pattern of the selected design pattern. Then, the graphic form D is divided into minimum plotting grid units (S-114). Thereafter, the positions of the profile of the graphic form A and the profile of the graphic form B are compared with each other (S-115). In other words, the distance L between the profile of the graphic form A and the profile of the graphic form B which corresponds to the profile of the graphic form A is calculated. Then, a shot rank is determined based on the distance L (S-116), and then, a dose amount is determined based on the shot rank (S-117).

Then, it is discriminated whether or not the processing described above has all completed for the profile (side) of the selected design pattern (S-130), and if the processing has not completed as yet, then the control returns to step S-103. If the processing has completed, then the predetermined dose amount $D_0$ is set as a plotting pattern of a plotting unit of an appropriate magnitude (a minimum plotting grid or a plotting grid of a magnitude as large as an integral number of times a minimum plotting grid) for the graphic form C and a graphic form D' (which will be hereinafter described) (S-131). Then, it is discriminated whether or not the processing for all design patterns in the extracted partition has completed (S-132), and if the processing has not completed, then the control returns to step S102. If the processing has completed, then it is discriminated whether or not the processing for all of the partitions has completed (S-133), and if the processing has not completed here, then the control returns to step S-101. Plotting pattern data can be produced by performing the processing described above.

If it is discriminated in step S-104 that the aimed profile (side) of the selected design pattern is in contact with another design pattern, then the aimed profile (side) of the selected design pattern is divided into a profile portion or portions at which the selected design pattern is not in contact with another design pattern and another profile portion or portions at which the selected design pattern is in contact with another design pattern (S-120) (refer to FIG. 7). Then, for each non-contacting profile portion of the selected design pattern, it is discriminated whether or not the processing has completed (S-121), and if the processing has completed, then the control advances to step S-130. On the contrary if the processing has not completed, then the control advances to step S-110.

On the other hand, for each contacting profile portion of the selected design pattern, an n-fold design pattern is determined by multiplying the design pattern to n times the minimum design pattern un it length using a conversion program while maintaining the grids upon pattern designing (S-122). The n-fold design pattern obtained is determined as graphic form A. Then, based on the graphic form A, the n-fold design pattern is converted using a conversion program so that the profile thereof may come on minimum plotting grids adjacent the profile (S-123) thereby to obtain a plotting pattern. The plotting pattern obtained is determined as graphic form B. Then, a graphic form C having a profile positioned on the inner side by one minimum plotting grid length from the profile of the graphic form B is determined (S-124).

Then, the graphic form C is subtracted from the graphic form B to obtain a graphic form D' (S-125). This graphic form D' corresponds to a portion of the plotting pattern which includes the profile portion of the n-fold design pattern of the selected design pattern which is in contact with another design pattern. Then, the graphic form D' is divided into minimum plotting grid units (S-126). Thereafter, the control advances to step S-130.

Figure 9A:
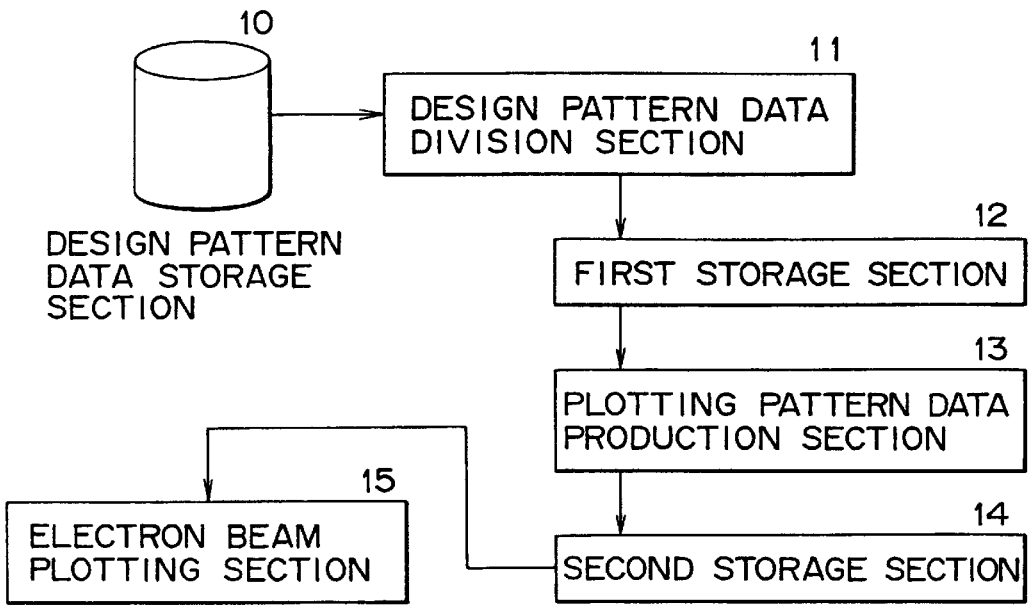
FIGS. 9A and 9B are diagrammatic views illustrating concepts of an electron beam plotting apparatus according to Example 1.

A concept of the electron beam plotting apparatus of Example 1 is illustrated in FIG. 9A. Referring to FIG. 9A, the electron beam plotting apparatus includes a design pattern data storage unit 10, a design pattern data division section 11 a first storage section 12 a plotting pattern data production section 13 a second storage section 14 and an electron beam plotting section 15. Data of a design pattern are stored in the design pattern data storage unit 10. Where the electron beam plotting apparatus is of the vector scanning type, it performs plotting in units of a region called field. Meanwhile, where the electron beam plotting apparatus is of the raster scanning type, it performs plotting in units of a region called raster scanning width. Accordingly, the data of the design pattern are divided into data of a predetermined size (size corresponding to one field or one raster scanning width) by the design pattern data division section 11. The thus divided data of the design pattern are stored into the first storage section 12. Based on the divided data of the design pattern stored in the first storage section 12 plotting pattern data are produced by the plotting pattern data production section 13. The thus produced plotting pattern data are stored into the second storage section 14. It is to be noted that, since the electron beam plotting section 15 may be of the vector scanning type, the raster scanning type or the variable shaping beam type which are all well known in the art, detailed description thereof is omitted herein.

Based on the divided data of the design pattern, the plotting pattern data production section 13 (A): produces an n-fold design pattern by multiplying, where the minimum plotting grid length in plotting with an electron beam is N times (N>1) the minimum design pattern unit length, the design pattern to n times the minimum design pattern unit length (n>1 and n<N) and then converts the n-fold design pattern so that the profiles thereof may come on those minimum plotting grids adjacent the profiles in order to obtain a plotting pattern, and (B): (a): sets, for each portion of the plotting pattern which includes a profile of the n-fold design pattern, a dose amount in accordance with a ratio in area of the n-fold design pattern which occupies the minimum plotting grid, but (b): sets a predetermined dose amount for each portion of the plotting pattern which does not include any profile of the n-fold design pattern. Since such processing by the plotting pattern data production section 13 may be similar to the operation described hereinabove with reference to the flow charts of FIGS. 3 to 5 detailed description of it is omitted here. It is to be noted that a program for performing the operation described hereinabove with reference to the flow charts of FIGS. 3 to 5 may be stored, for example, in a ROM. On the other hand, if a plurality of second storage sections 14 are prepared such that, while plotting pattern data produced are stored into one of the second storage sections 14 plotting pattern data having been produced already are read out from another one of the second storage sections 14 and plotting is performed with the read out plotting pattern data by the electron beam plotting section 15 then production of plotting pattern data and plotting can be proceeded simultaneously.

Figure 9B:
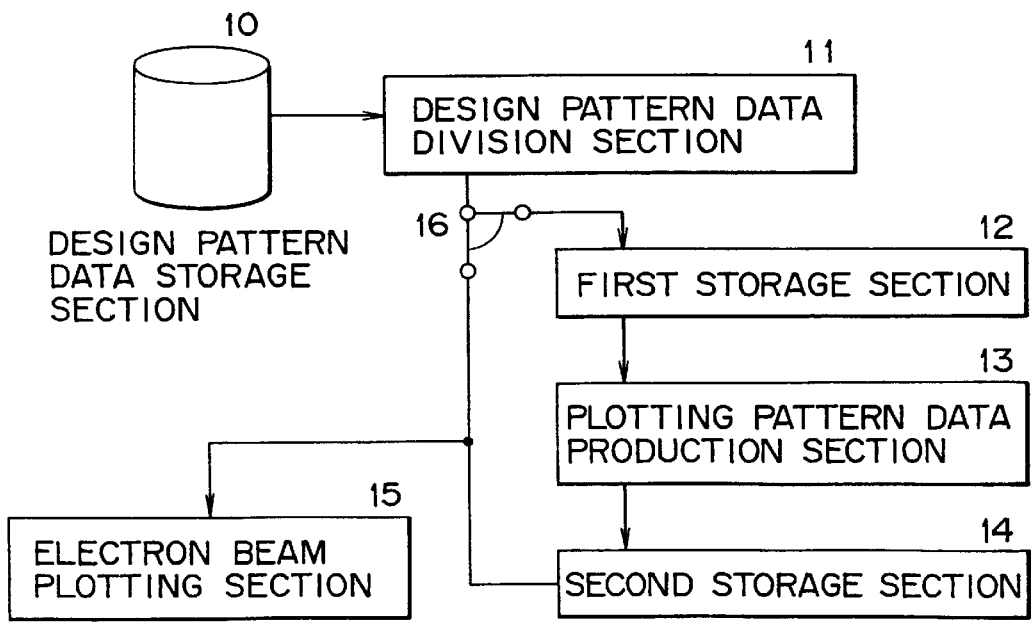

It is to be noted that, if the electron beam plotting apparatus of Example 1 additionally includes a switch 16 provided on the downstream side of the design pattern data division section 11 as seen in FIG. 9B, then when it is intended to form a rough pattern on a processing object, plotting of a pattern can be performed without the intervention of the plotting pattern data production section 13.

EXAMPLE 2

Example 2 relates to modifications to the plotting pattern data production method, electron beam plotting method, substrate working method and electron beam plotting apparatus according to the first embodiment of the present invention described in Example 1 above. In Example 1 an n-fold design pattern was converted so that the size of a plotting pattern might be equal to or larger than the size of the n-fold design pattern. In contrast, in Example 2, an n-fold design pattern was converted so that the size of a plotting pattern might be equal to or smaller than the size of the n-fold design pattern. In particular, an n-fold design pattern was converted so that the profiles thereof might come on minimum drawing grids on the inner side adjacent the profiles.

Figure 10:
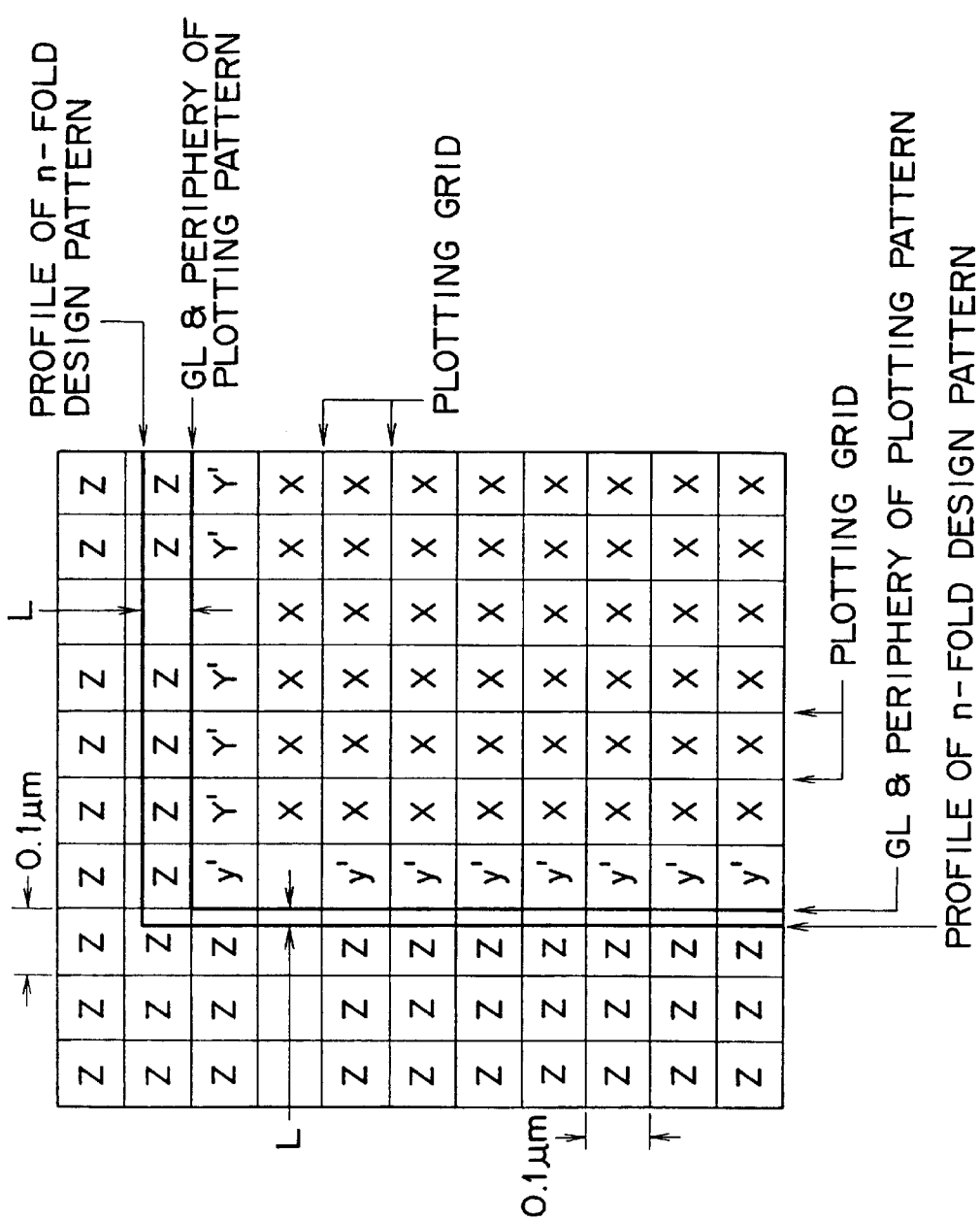

FIG. 10 schematically illustrates a relationship in arrangement of an n-fold design pattern (only part of which is shown) and minimum plotting grids. Those minimum plotting grids denoted by "X'" indicate portions of the plotting pattern which do not include the profiles of the n-fold design pattern, and those minimum plotting grids denoted by "Y'" and "y'" indicate portions of the plotting pattern which include the profiles of the n-fold design pattern. It is to be noted that the minimum plotting grids denoted by "Y'" and "y'" are arranged adjacent an outermost periphery of a graphic form composed of a set of the minimum plotting grids denoted by "X'". Meanwhile, those minimum plotting grids denoted by "Z" indicate minimum plotting grids which do not include the n-fold design pattern. In other words, no plotting is performed for the minimum plotting grids denoted by "Z".

Also in Example 2 for portions of the plotting pattern which include the profiles of the n-fold design pattern (for a set of the minimum plotting grids "Y'" and "y'", dose amounts corresponding to ratios in area of the n-fold design pattern which occupies the minimum plotting grids is set. More particularly, in Example 2 shot ranks are determined in accordance with the distances L from outermost plotting grid lines GL of the portions of the plotting pattern which include the n-fold design pattern to the profiles of the n-fold design pattern which occupy the minimum plotting grids, and based on the thus determined shot ranks, dose amounts $D_{OL}$ are set in accordance with the following expression. The dose amounts $D_{OL}$ are equal to or greater than the dose amount $D_0$. On the other hand, for those portions of the plotting pattern which do not include the profiles of the n-fold design pattern (for a set of the minimum plotting grids "X"), the predetermined doze amount $D_0$ is set.

Dose amount $D_{OL}$={(initial value)+(step)×shot rank)}×(standard dose amount)

Except the matters described above, the plotting pattern data production method, electron beam plotting method, substrate working method and electron beam plotting apparatus of Example 2 may be similar to those of Example 1 and therefore, detailed description of them is omitted here.

Further, an n-fold design pat tern may be converted so that the profiles thereof may come on those minimum plotting grids which are most adjacent the profiles. In this instance, where the n-fold design pattern is converted so that the profiles thereof may come on those minimum plotting grids on the outer side adjacent the profiles, doze amounts may be set using the method described hereinabove in connection with Example 1 but where the n-fold design pattern is converted so that the profiles thereof may come on those minimum plotting grids on the inner side adjacent the profiles, doze amounts may be set using the method described hereinabove in connection with Example 2.

EXAMPLE 3

Example 3 relates to modifications to the plotting pattern data production method, electron beam plotting method, substrate working method and electron beam plotting apparatus according to the second embodiment of the present invention. In Example 3 different from Example 1 taking an influence of back scattering into consideration, proximity effect correction is performed to determine a dose amount at a portion of a plotting pattern which includes a profile of an n-fold design pattern. Also in the plotting pattern data production method of Example 3 the minimum plotting grid length in plotting with an electron beam was set to 0.1 μm, and the minimum design pattern unit length was set to 0.005 μm. Consequently, N=20. Further, an n-fold design pattern was determined by multiplying the design pattern to 5 (=n) times the minimum design pattern unit length. Then, a plotting pattern was obtained by converting the n-fold design pattern so that the profiles thereof may come on those minimum plotting grids which are adjacent the profile. More particularly, the n-fold design pattern is converted so that the size of the plotting pattern may be equal to or larger than the n-fold design pattern. In other words, the n-fold design pattern was converted so that the profiles thereof may come on those minimum plotting grids on the outer side adjacent the profiles. It is to be noted that the values of N and n are not limited to the specific values mentioned above at all.

The relationship in arrangement between the n-fold design pattern (only part of which is shown) and minimum plotting grids is similar to that illustrated in FIG. 1. In Example 3 evaluation points $E_i$ are set at predetermined positions of the profiles (for example, middle points of the profiles (sides)) of the n-fold design pattern, where i=1, 2, . . . m and, in the example illustrated in FIG. 12A, m=4. Then, dose amounts of portions of the plotting pattern which include the profiles of the n-fold design pattern (the set of the minimum plotting grids "Y" and "y") are calculated by solving stored energy balance equations set up at individual evaluation points (with the plotting pattern shown in FIG. 12A, four stored energy balance equations). Meanwhile, for those portions of the plotting pattern which do not include the profiles of the n-fold design pattern (for the set of the minimum plotting grids "X"), a predetermined dose amount $D_0$ is set.

More particularly, in Example 3 an entire n-fold design pattern is partitioned into predetermined regions. Nine regions from among the thus partitioned regions are schematically shown in FIG. 12B. The size of the predetermined regions should be set to a size within which the influence of back scattering is effective, and may be set, for example, to 5 μm×5 μm. It is to be noted that the size of the regions should be selected suitably depending upon the acceleration voltage for an electron beam and so forth. Then, where f(r) is given as an energy intensity distribution function, the stored energy balance equation can be represented by the following expression (1), and more particularly, where m=4 it can be represented by the expressions (2-1) to (2-4). It is to be noted that the following parameters and symbols are used in the expression (1):

$EP_i$ . . . positions of the evaluation points $E_i$ (where i=1, 2, . . . m)

Figure 12A:
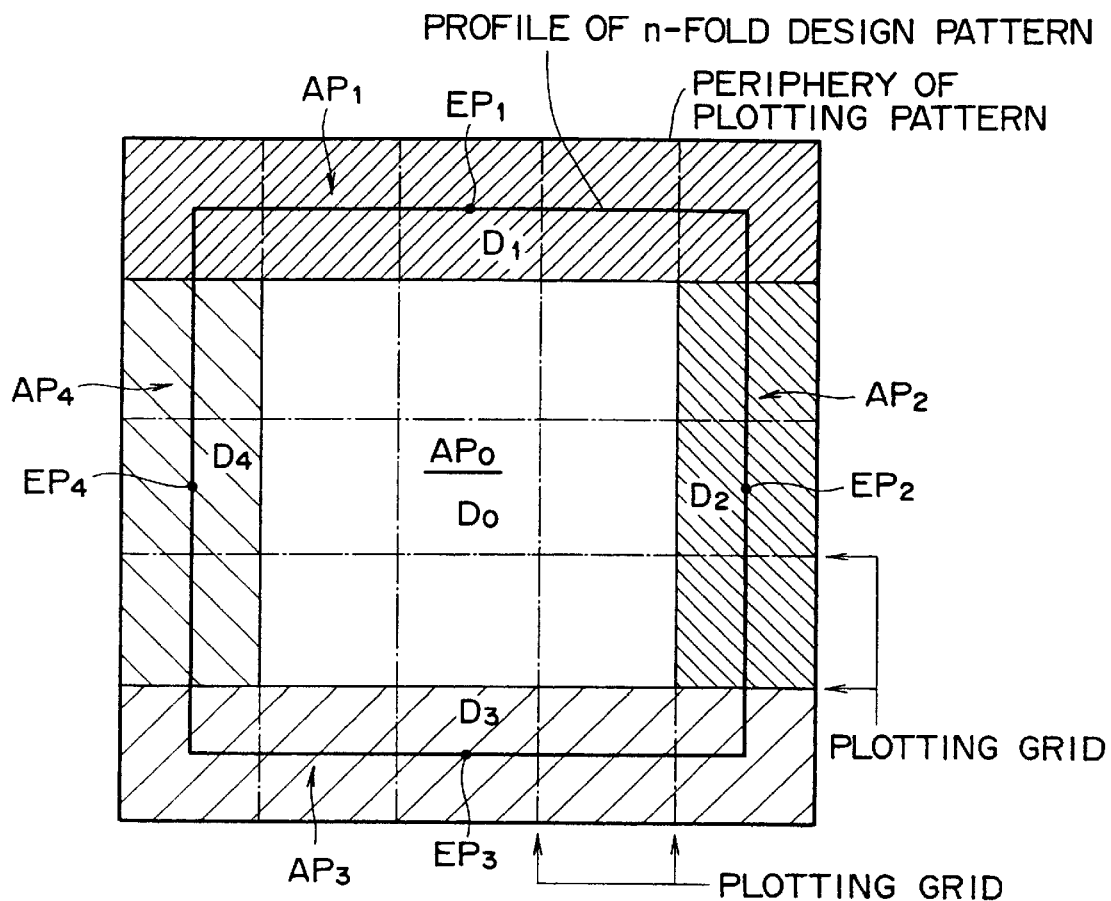
FIGS. 12A and 12B are diagrammatic views schematically showing a profile, evaluation points, partitioned regions and so forth of an n-fold design pattern in Example 3 of the present invention.
Figure 12B:
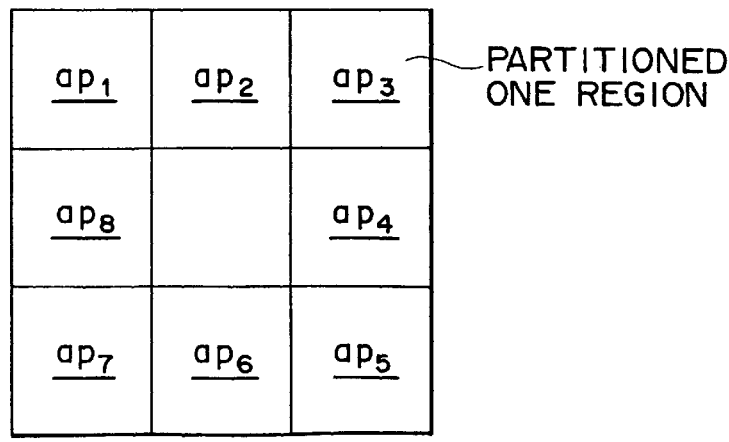

$D_j$ . . . dose amounts at those portions of the plotting pattern which include the profiles in which the evaluation points $E_j$ (where j=1, 2, . . . m) of the n-fold design pattern are included $AP_j$ . . . symbols indicating those portions of the plotting pattern including the profiles in which the evaluation points $E_j$ of the n-fold design pattern are included (those symbols are indicated with different slanting lines in FIG. 12A)

$D_0$ . . . predetermined dose amount $AP_0$ . . . symbol indicating a portion of the plotting pattern which does not include any profile of the n-fold design pattern $d_k$ . . . dose amounts at eight regions around a region including the n-fold design pattern in which the evaluation points $E_i$ are included, and k=1, 2, . . . , 8 (refer to FIG. 12B, it is to be noted that, in a region which is denoted by no reference symbol in FIG. 12B, $EP_i$ and $AP_0$ are included)

$ap_k$ . . . symbols representing the eight regions around the region including the n-fold design pattern in which the evaluation points $E_i$ are included $E_{th}$ . . . stored energy threshold value (stored energy amount when the profiles of the plotting pattern are plotted)

η . . . back scattering coefficient (also called reflection coefficient) of the EID function $β_f$ . . . forward scattering radius of the EID function $β_b$ . . . back scattering radius of the EID function $$\sum_{j=1}^{m} D_j \int_{r \in AP_j} f(r - EP_i) dr + \quad (1)$$

$$D_0 \int_{r \in AP_0} f(r - EP_i) dr + \sum_{k=1}^{8} d_k \int_{r \in ap_k} f(r - EP_i) dr = E_{th}$$

where $$f(r) = \frac{1}{\pi(1+\eta)} \frac{1}{\beta_f^2} \exp\left(-\frac{r^2}{\beta_f^2}\right) + \frac{\eta}{\beta_b^2} \exp\left(-\frac{r^2}{\beta_b^2}\right) \quad (2\text{-}1)$$

$$D_1 \int_{r \in AP_1} f(r - EP_1) dr + D_2 \int_{r \in AP_2} f(r - EP_1) dr + D_3 \int_{r \in AP_3} f(r - EP_1) dr +$$

$$D_4 \int_{r \in AP_4} f(r - EP_1) dr + D_0 \int_{r \in AP_0} f(r - EP_i) dr +$$

$$\sum_{k=1}^{8} d_k \int_{r \in ap_k} f(r - EP_i) dr = E_{th}$$

$$D_1 \int_{r \in AP_1} f(r - EP_2) dr + D_2 \int_{r \in AP_2} f(r - EP_2) dr + \quad (2\text{-}2)$$

$$D_3 \int_{r \in AP_3} f(r - EP_2) dr + D_4 \int_{r \in AP_4} f(r - EP_2) dr +$$

$$D_0 \int_{r \in AP_0} f(r - EP_2) dr + \sum_{k=1}^{8} d_k \int_{r \in ap_k} f(r - EP_2) dr = E_{th}$$

$$D_1 \int_{r \in AP_1} f(r - EP_3) dr + D_2 \int_{r \in AP_2} f(r - EP_3) dr + \quad (2\text{-}3)$$

$$D_3 \int_{r \in AP_3} f(r - EP_3) dr + D_4 \int_{r \in AP_4} f(r - EP_3) dr +$$

$$D_0 \int_{r \in AP_0} f(r - EP_3) dr + \sum_{k=1}^{8} d_k \int_{r \in ap_k} f(r - EP_3) dr = E_{th}$$

$$D_1 \int_{r \in AP_1} f(r - EP_4) dr + D_2 \int_{r \in AP_2} f(r - EP_4) dr + \quad (2\text{-}4)$$

$$D_3 \int_{r \in AP_3} f(r - EP_4) dr + D_4 \int_{r \in AP_4} f(r - EP_4) dr +$$

$$D_0 \int_{r \in AP_0} f(r - EP_4) dr + \sum_{k=1}^{8} d_k \int_{r \in ap_k} f(r - EP_4) dr = E_{th}$$

Figure 3:
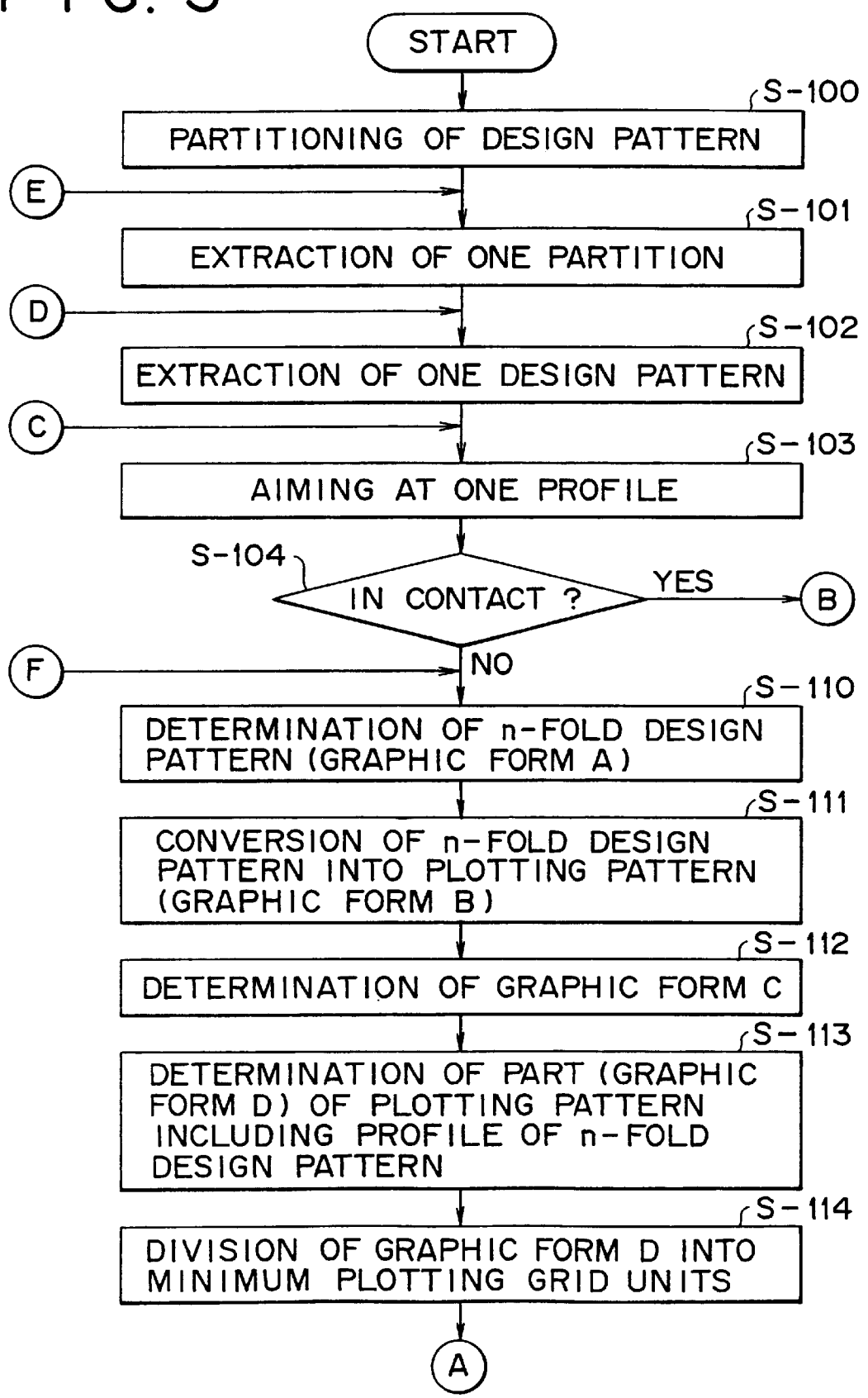
FIGS. 3 to 5 are flow charts illustrating operation for obtaining plotting pattern data according to Example 1.
Figure 4:
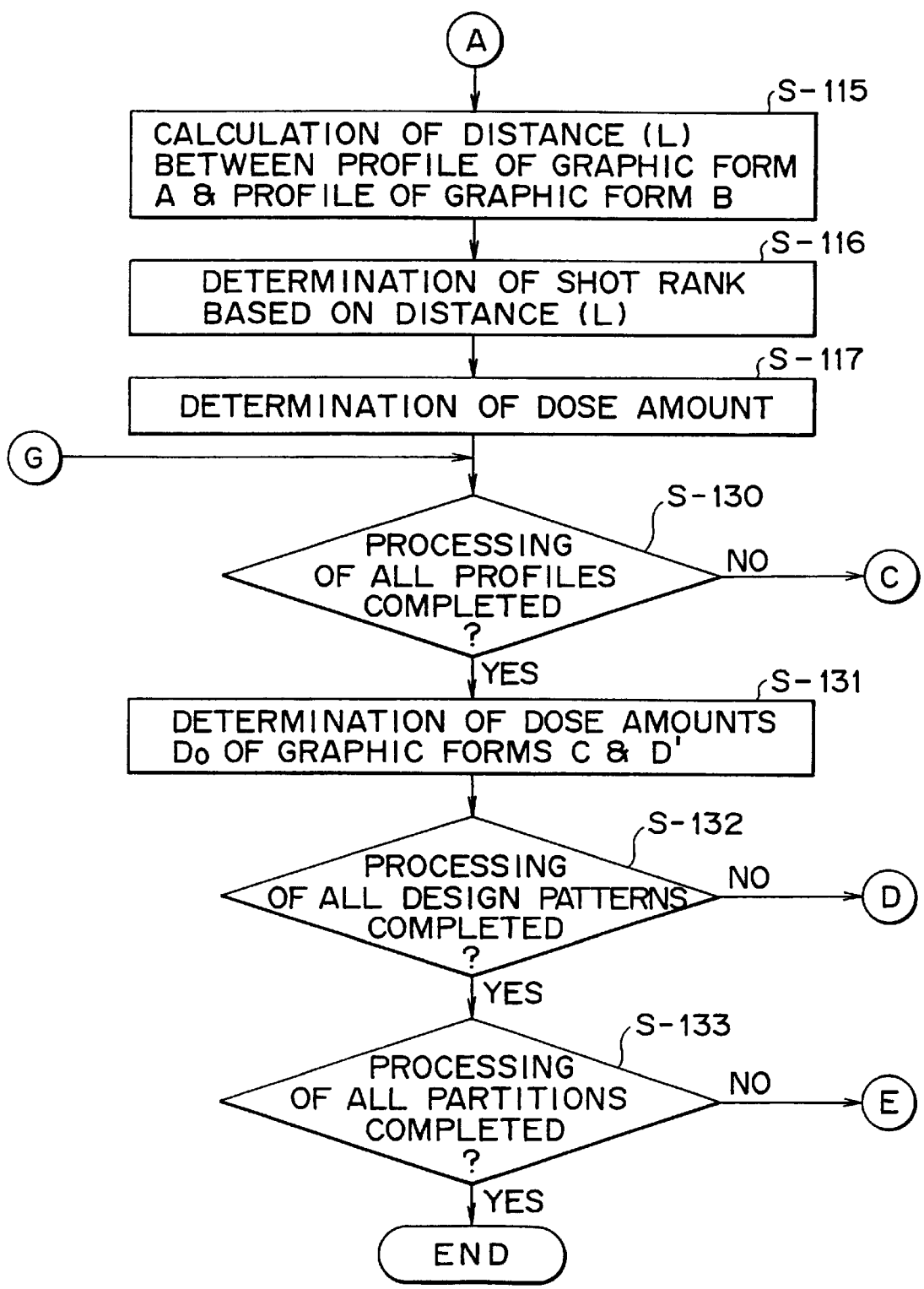
Figure 5:
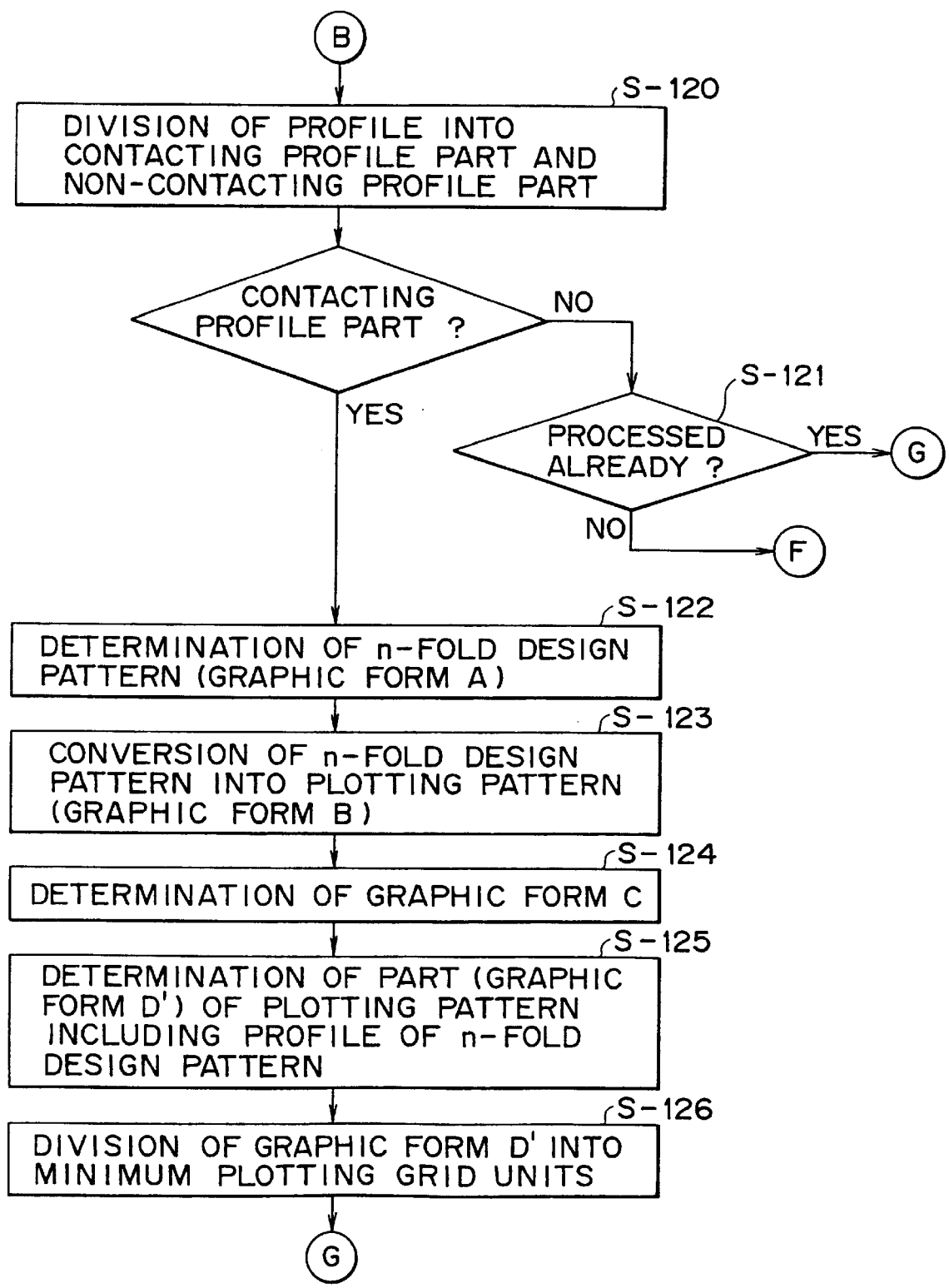

Details of operation for obtaining plotting pattern data in Example 3 are similar to those of the operation in Example 1 described hereinabove with reference to FIGS. 3 to 5 except the following points. In particular, in place of the steps S-115 S-116 and S-117 of Example 1 a stored energy balance equation is calculated based on the expression (1). In order to facilitate calculation by a computer, the stored energy balance equation is represented by a determinant of the following expression (3). It is to be noted that "I" is a coefficient matrix, and an exposure light intensity acting upon each evaluation point of the plotting pattern is set to "I". "D" is a matrix of unknown doze amounts ($D_j$), and "E" is a matrix of values of the right side of the expression (1).

$$ID = E \quad (3)$$

Then, similarly as in Example 1 it is discriminated whether or not processing for all regions has completed (S-133), and if the processing has completed, the determinant of the expression (3) is calculated to calculate dose amounts at those positions of the plotting pattern which include the profiles of the n-fold design pattern. It is to be noted that, in the expression (1), $D_0$ is used as an initial value of $d_k$. While, for example, an SOR method of an iteration method can be used as a calculation method for the matrix of the expression (3), the applicable method is not limited to the specific solving method. Here, since the tolerance for the doze amount is sufficient with approximately 0.01 $\mu$C/cm² for practical use, the number of times of iteration may be approximately 5 times. Further, since it is meaningless if the solution to the dose amount does not have a value with which actual plotting is possible, the condition that the minimum value of the solution to the dose amount must be equal to or higher than a minimum value of the dose amount and equal to or lower than a maximum value of the dose amount with which actual plotting is possible is additionally used for calculation. Plotting pattern data can be produced by performing the processing described above.

Based on the plotting pattern data produced in this manner and composed of the dose amounts and the plotting pattern, a pattern was plotted on a processing object using an electron beam (refer to the schematic view of FIG. 2A). More particularly, also in Example 3 the processing object was set to a resist applied to a mask blank (which corresponds to a substrate) to be used for production of a mask for exposure to be used for pattern formation of a semiconductor integrated circuit. It is to be noted that, if plotting is performed, then for those portions (the set of minimum plotting grids "Y" and "y") of the plotting pattern including the profiles of the n-fold design pattern, with the thus calculated dose amounts, then because of an influence of back scattering by plotting with an electron beam at those positions of the plotting pattern which do not include the profiles of the n-fold design pattern, a plotting pattern which extends to a portion of the plotting pattern which does not include any profile of the n-fold design pattern to a minimum plotting grid which includes a profile of the n-fold design pattern is formed.

Then, using an etching mask obtained by developing the thus plotted resist, the mask blank serving as a substrate was patterned to produce a mask for exposure. In Example 3 an electron beam plotting apparatus of the vector scanning type of a spot electron beam was used for the electron beam plotting apparatus. Then, a mask for exposure was produced based on a known production process for a mask for exposure.

In order to perform inspection of the pattern formed on the mask for exposure which corresponds to a substrate, comparison between the pattern formed on the obtained mask for exposure and the design pattern was performed using an inspection apparatus which include s a line sensor. The comparison revealed that the two patterns (particularly at the profiles) exhibit good coincidence therebetween. In particular, in Example 3 a pattern can be formed in units of 0.025 $\mu$m (minimum design pattern unit length=0.005 $\mu$m) on a mask for exposure and the resolution in an electron beam plotting method is improved by four times.

It is to be noted that, while, in Example 3 an electron beam plotting apparatus of the vector scanning type was used, the applicable electron beam plotting apparatus is not limited to the apparatus of the specific type, and an electron beam plotting apparatus of the raster scanning type or of the variable shaping beam type may be used instead. Further, where an electron beam plotting apparatus wherein a number of regions as large as a plurality of times a minimum plotting grid can be plotted at a time is used, the unit region of plotting is not limited to a minimum plotting grid. Further, any one of a positive resist and a negative resist can be used.

The construction of the electron beam plotting apparatus of Example 3 may be basically same as the construction of the electron beam plotting apparatus of Example 1 illustrated in FIGS. 9A and 9B. The electron beam plotting apparatus of Example 3 is different from the electron beam plotting apparatus of Example 1 only in contents of processing performed by the plotting pattern data production section 13. The plotting pattern data production section 13 in Example 3 produces plotting pattern data based on the plotting pattern data production method of Example 3 described above.

EXAMPLE 4

Example 4 relates to modifications to the plotting pattern data production method, electron beam plotting method, substrate working method and electron beam plotting apparatus according to the second embodiment of the present invention described above in connection with Example 3. In Example 3 an n-fold design pattern was converted so that the size of a plotting pattern might be equal to or larger than the size of the n-fold design pattern. In contrast, in Example 4 an n-fold design pattern is converted so that the size of a plotting pattern may be equal to or smaller than the size of the n-fold design pattern. In other words, an n-fold design pattern is converted so that the profiles thereof may come on those minimum plotting grids on the inner side adjacent the profiles.

Figure 13:
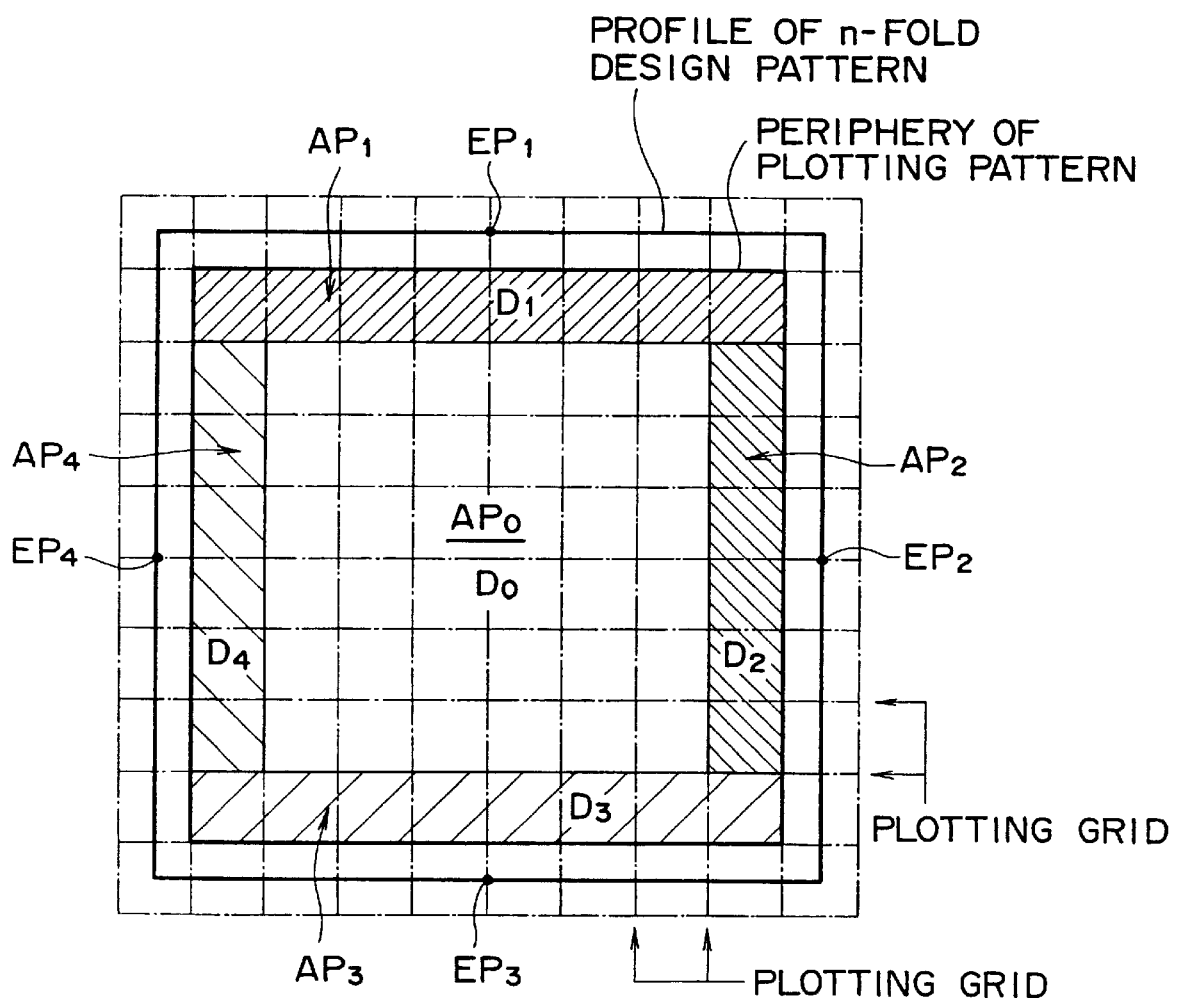
FIG. 13 is a diagrammatic view schematically showing a profile, evaluation points and so forth of an n-fold design pattern in Example 4 of the present invention.

The relationship in arrangement between the n-fold design pattern (only part of which is shown) and the minimum plotting grids is similar to that illustrated in FIG. 10. In Example 4 evaluation points $E_i$ are set at predetermined positions of profiles (for example, middle points of profiles (sides)) of the n-fold design pattern, where i=1, 2, ... m and, in the example illustrated in FIG. 13, m=4. Then, dose amounts of those portions of the plotting pattern which include the profiles of the n-fold design pattern (a set of the minimum plotting grids "Y'" and "y'") are calculated by solving stored energy balance equations set up at the individual evaluation points (with the plotting pattern shown in FIG. 13, four stored energy balance equations). Meanwhile, for those portions of the plotting pattern which do not include the profiles of the n-fold design pattern (for a set of the minimum plotting grids "X"), a predetermined dose amount $D_0$ is set. Except the matters described above, the plotting pattern data production method, electron beam plotting method, substrate working method and electron beam plotting apparatus of Example 4 may be similar to those of Example 3, and therefore, detailed description of them is omitted here.

Further, similarly as in the case of FIG. 11, an n-fold design pattern may be converted so that the profiles thereof may come on those minimum plotting grids which are most adjacent the profiles. In this instance, where the n-fold design pattern is converted so that the profiles thereof may come on those minimum plotting grids on the outer side adjacent the profiles, dose amounts may be determined using the method described hereinabove in connection with Example 3 but where the n-fold design pattern is converted so that the profiles thereof may come on those minimum plotting grids on the inner side adjacent the profiles, dose amounts may be determined using the method described hereinabove in connection with Example 4.

While the present invention is described above in connection with the preferred embodiments thereof, the present invention is not limited to the specific embodiments described above. The numerical values and the conditions described in connection with the embodiments of the present invention are for illustrative purpose only and can be varied suitably. While description of the embodiments of the present invention is described above taking only production of a mask for exposure as an example, the present invention can be applied also to, for example, formation of a pattern of a semiconductor integrated circuit. In this instance, for example, an electron beam sensitive resist is applied to a processing object layer formed on a semiconductor substrate such as, for example, a metal layer to be used for formation of wiring lines made of an aluminum alloy, and a pattern is plotted on the resist using an electron beam. Then, using an etching mask obtained by developing the thus plotted resist, the processing object layer should be patterned.

Having now fully described the invention, it will be apparent to one of ordinary skill in the art that many changes and modifications can be made thereto without departing from the spirit and scope of the invention as set forth herein.

What is claimed is:

1. A plotting pattern data production method for producing plotting pattern data used to plot a pattern using an electron beam, comprising the steps of:
   producing an n-fold design pattern by multiplying a design pattern by n times a minimum design pattern unit length, wherein a minimum plotting length between lines of a plotting grid used in plotting with an electron beam is N times the minimum design pattern unit length, with N being larger than 1 and n being larger than 1 but less than N;
   obtaining a plotting pattern by converting the n-fold design pattern such that profiles of the n-fold design pattern coincide with lines of the plotting grid adjacent to the profiles of the n-fold design pattern; and
   setting a first predetermined dose amount for each portion of the plotting pattern that includes any profile of the n-fold design pattern in accordance with a ratio in area of the n-fold design pattern which occupies the plotting pattern and setting a second predetermined dose amount for each portion of the plotting pattern that does not include any profile of the n-fold design pattern.

2. A plotting pattern data production method according to claim 1, wherein the n-fold design pattern is converted so that a size of the plotting pattern may be equal to or larger than the n-fold design pattern.

3. A plotting pattern data production method according to claim 2, wherein the first predetermined dose amount is equal to or smaller than the second predetermined dose amount.

4. A plotting pattern data production method according to claim 3, wherein the first predetermined dose amount is set among different stages in accordance with a ratio in area of the n-fold design pattern which occupies the plotting grid.

5. A plotting pattern data production method according to claim 1, wherein the n-fold design pattern is converted so that a size of the plotting pattern may be equal to or smaller than the n-fold design pattern.

6. A plotting pattern data production method according to claim 5, wherein the first predetermined dose amount is equal to or larger than the second predetermined dose amount.

7. A plotting pattern data production method according to claim 6, wherein the first predetermined dose amount is set among different stages in accordance with a ratio in area of the n-fold design pattern which occupies the plotting grid.

8. A plotting pattern data production method according to claim 1, wherein when a first n-fold design pattern and a second n-fold design pattern are in contact with each other, the second predetermined dose amount is set for a portion of the plotting pattern that includes a portion of a profile of the first n-fold design pattern at which the first n-fold design pattern is in contact with the second n-fold design pattern.

9. A plotting pattern data production method according to claim 1, wherein an object of plotting of a pattern performed using an electron beam is a resist applied to a mask blank for production of a mask for exposure to be used for formation of a pattern of a semiconductor integrate d circuit.

10. A plotting pattern data production method according to claim 1, wherein an object of plotting of a pattern performed using an electron beam is a resist to be used for formation of a pattern of a semiconductor integrated circuit.

11. A plotting pattern data production method for producing plotting pattern data used to plot a pattern using an electron beam, comprising the steps of:
   producing an n-fold design pattern by multiplying a design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtaining a plotting pattern by converting the n-fold design pattern such that profiles of the n-fold design pattern coincide with lines of the plotting grid adjacent to the profiles of the n-fold design pattern; and setting evaluation points $E_i$ and $E_j$ at predetermined positions of the profiles of the n-fold design pattern and solving a stored energy balance equation set up at each of the evaluation points to determine a first predetermined dose amount at each portion of the plotting pattern that includes any profile of the n-fold design pattern and setting a second predetermined dose amount for each portion of the plotting pattern that does not include any profile of the n-fold design pattern.

12. A plotting pattern data production method according to claim 11, wherein the entire n-fold design pattern is partitioned into predetermined regions, and where positions of the evaluation points $E_i$ where i=1, 2, . . . , m are represented by $EP_i$, dose amounts at those portions of the plotting pattern which include the profiles in which the evaluation points $E_i$ of the n-fold design pattern are included and represented by $D_j$, where j=1, 2 . . . . , m, and the portions of the plotting pattern are represented by $AP_j$, the second predetermined dose amount is represented by $D_0$ and the portion of the plotting pattern which does not include any profile of the n-fold design pattern is represented by $AP_0$ dose amounts at eight regions around a region that includes the n-fold design pattern in which the evaluation points $E_i$ are included are represented by $d_k$ where k=1, 2, . . . , 8 and the eight regions are represented by $ap_k$, a stored energy threshold value is represented by $E_{th}$, an energy intensity distribution function is represented by f(r), and a back scattering coefficient of the energy intensity distribution function is represented by η and a forward scattering radius of the energy intensity distribution function is represented by $β_f$ while a back scattering radius of the energy intensity distribution function is represented by $β_b$, the stored energy balance equation is given by the following expression (1):

$$\sum_{j=1}^{m} D_j \int_{r \in APj} f(r - EP_i)dr + \\ D_0 \int_{r \in AP_0} f(r - EP_i)dr + \sum_{k=1}^{8} d_k \int_{r \in ap_k} f(r - EP_i)dr = E_{th} \quad (1)$$

where $$f(r) = \frac{1}{\pi(1+\eta)} \left[ \frac{1}{\beta_{f2}} \exp\left(-\frac{r^2}{\beta_{f2}}\right) + \frac{\eta}{\beta_{b2}} \exp\left(-\frac{r^2}{\beta_{b2}}\right) \right].$$

13. A plotting pattern data production method according to claim 11, wherein the n-fold design pattern is converted so that a size of the plotting pattern may be equal to or larger than the n-fold design pattern.

14. A plotting pattern data production method according to claim 11, wherein the n-fold design pattern is converted so that a size of the plotting pattern may be equal to or smaller than the n-fold design pattern.

15. A plotting pattern data production method according to claim 11, wherein when a first n-fold design pattern and a second n-fold design pattern are in contact with each other, the second predetermined dose amount is set for a portion of the plotting pattern that includes a portion of a profile of the first n-fold design pattern at which the first n-fold design pattern is in contact with the second n-fold design pattern.

16. A plotting pattern data production method according to claim 11, wherein an object of plotting of a pattern performed using an electron beam is a resist applied to a mask blank for production of a mask for exposure to be used for formation of a pattern of a semiconductor integrated circuit.

17. A plotting pattern data production method according to claim 11, wherein an object of plotting of a pattern performed using an electron beam is a resist to be used for formation of a pattern of a semiconductor integrated circuit.

18. An electron beam plotting method for plotting a pattern on a processing object based on plotting pattern data using an electron beam, comprising:

plotting a pattern on a processing object using an electron beam based on plotting pattern data composed of dose amounts and a plotting pattern and produced by a pattern plotting pattern data production method which includes the steps of:

producing an n-fold design pattern by multiplying a design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtaining a plotting pattern by converting the n-fold design pattern such that profiles of the n-fold design pattern coincide with lines of the plotting grid adjacent to the profiles of the n-fold design pattern; and setting a first predetermined dose amount for each portion of the plotting pattern that includes any profile of the n-fold design pattern in accordance with a ratio in area of the n-fold design pattern which occupies the plotting pattern and setting a second predetermined dose amount for each portion of the plotting pattern that does not include any profile of the n-fold design pattern.

19. An electron beam plotting method according to claim 18, wherein the n-fold design pattern is converted so that a size of the plotting pattern may be equal to or larger than the n-fold design pattern.

20. An electron beam plotting method according to claim 19, wherein the first predetermined dose amount is equal to or smaller than the second predetermined dose amount.

21. An electron beam plotting method according to claim 20, wherein the first predetermined dose amount is set among different stages in accordance with a ratio in area of the n-fold design pattern that occupies the plotting grid.

22. An electron beam plotting method according to claim 18, wherein the n-fold design pattern is converted so that a size of the plotting pattern may be equal to or smaller than the n-fold design pattern.

23. An electron beam plotting method according to claim 22, wherein the first predetermined dose amount is equal to or larger than the second predetermined dose amount.

24. An electron beam plotting method according to claim 23, wherein the first predetermined dose amount is set among different stages in accordance with a ratio in area of the n-fold design pattern that occupies the plotting grid.

25. An electron beam plotting method according to claim 18, wherein when a first n-fold design pattern and a second n-fold design pattern are in contact with each other, the second predetermined dose amount is set for a portion of the plotting pattern which includes a portion of a profile of the first n-fold design pattern at which the first n-fold design pattern is in contact with the second n-fold design pattern.

26. An electron beam plotting method according to claim 18, wherein the processing object is a resist applied to a mask blank for production of a mask for exposure to be used for formation of a pattern of a semiconductor integrated circuit.

27. An electron beam plotting method according to claim 18, wherein the processing object is a resist to be used for formation of a pattern of a semiconductor integrated circuit.

28. An electron beam plotting method for plotting a pattern on a processing object based on plotting pattern data using an electron beam, comprising:

plotting a pattern on a processing object using an electron beam based on plotting pattern data composed of dose amounts and a plotting pattern and produced by a pattern plotting pattern data production method which includes the steps of:

producing an n-fold design pattern by multiplying a design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtaining a plotting pattern by converting the n-fold design pattern such that profiles of the n-fold design pattern coincide with lines of the plotting grid adjacent to the profiles of the n-fold design pattern; and setting evaluation points $E_i$ and $E_j$ at predetermined positions of the profiles of the n-fold design pattern and solving a stored energy balance equation set up at each of the evaluation points to determine a first predetermined dose amount at each portion of the plotting pattern that includes any profile of the n-fold design pattern and setting a second predetermined dose amount for each portion of the plotting pattern that does not include any profile of the n-fold design pattern.

29. An electron beam plotting method according to claim 28, wherein the entire n-fold design pattern is partitioned into predetermined regions, and where positions of the evaluation points $E_i$ where i=1, 2, . . . , m are represented by $EP_i$, dose amounts at those portions of the plotting pattern which include the profiles in which the evaluation points $E_i$ of the n-fold design pattern are included and represented by $D_j$, where j=1 2, . . . , m, and the portions of the plotting pattern are represented by $AP_j$, the second predetermined dose amount is represented by $D_0$ and the portion of the plotting pattern which does not include any profile of the n-fold design pattern is represented by $AP_0$, dose amounts at eight regions around a region that includes the n-fold design pattern in which the evaluation points $E_i$ are included are represented by $d_k$ where k=1, 2, . . . , 8 and the eight regions are represented by $ap_k$, a stored energy threshold value is represented by $E_{th}$, an energy intensity distribution function is represented by $f(r)$, and a back scattering coefficient of the energy intensity distribution function is represented by $\eta$ and a forward scattering radius of the energy intensity distribution function is represented by $\beta_f$ while a back scattering radius of the energy intensity distribution function is represented by $\beta_b$, the stored energy balance equation is given by the following expression (1):

$$\sum_{j=1}^{m} D_j \int_{r \in AP_j} f(r - EP_i) dr + \quad (1)$$

$$D_0 \int_{r \in AP_0} f(r - EP_i) dr + \sum_{k=1}^{8} d_k \int_{r \in ap_k} f(r - EP_i) dr = E_{th}$$

$$\text{where } f(r) = \frac{1}{\pi(1+\eta)} \left[ \frac{1}{\beta_f^2} \exp - \frac{r^2}{\beta_f^2} + \frac{\eta}{\beta_b^2} \exp - \frac{r^2}{\beta_b^2} \right].$$

30. An electron beam plotting method according to claim 28, wherein the n-fold design pattern is converted so that a size of the plotting pattern may be equal to or larger than the n-fold design pattern.

31. An electron beam plotting method according to claim 28, wherein the n-fold design pattern is converted so that a size of the plotting pattern may be equal to or smaller than the n-fold design pattern.

32. An electron beam plotting method according to claim 28, wherein when a first n-fold design pattern and a second n-fold design pattern are in contact with each other, the second predetermined dose amount is set for a portion of the plotting pattern that includes a portion of a profile of the first n-fold design pattern at which the first n-fold design pattern is in contact with the second n-fold design pattern.

33. An electron beam plotting method according to claim 28, wherein an object of plotting of a pattern performed using an electron beam is a resist applied to a mask blank for production of a mask for exposure to be used for formation of a pattern of a semiconductor integrated circuit.

34. An electron beam plotting method according to claim 28, wherein an object of plotting of a pattern performed using an electron beam is a resist to be used for formation of a pattern of a semiconductor integrated circuit.

35. A substrate working method for working a substrate using an electron beam plotting method based on plotting pattern data, comprising:

plotting a pattern on a resist applied to a substrate using an electron beam based on plotting pattern data composed of dose amounts and a plotting pattern produced by a plotting pattern data production method that includes the steps of:

producing an n-fold design pattern by multiplying a design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtaining a plotting pattern by converting the n-fold design pattern such that profiles of the n-fold design pattern coincide with lines of the plotting grid adjacent to the profiles of the n-fold design pattern;

setting a first predetermined dose amount for each portion of the plotting pattern that includes any profile of the n-fold design pattern in accordance with a ratio in area of the n-fold design pattern which occupies the plotting pattern and setting a second predetermined dose amount for each portion of the plotting pattern that does not include any profile of the n-fold design pattern; and developing the plotted resist to produce an etching mask and patterning the substrate using the etching mask.

36. A substrate working method according to claim 35, wherein the n-fold design pattern is converted so that a size of the plotting pattern may be equal to or larger than the n-fold design pattern.

37. A substrate working method according to claim 36, wherein the first predetermined dose amount is equal to or smaller than the second predetermined dose amount.

38. A substrate working method according to claim 37, wherein the first predetermined dose amount is set among different stages in accordance with a ratio in area of the n-fold design pattern which occupies the plotting grid.

39. A substrate working method according to claim 35, wherein the n-fold design pattern is converted so that a size of the plotting pattern may be equal to or smaller than the n-fold design pattern.

40. A substrate working method according to claim 39, wherein the first predetermined dose amount is equal to or larger than the second predetermined dose amount.

41. A substrate working method according to claim 40, wherein the first predetermined dose amount is set among different stages in accordance with a ratio in area of the n-fold design pattern which occupies the plotting grid.

42. A substrate working method according to claim 35, wherein when a first n-fold design pattern and a second n-fold design pattern are in contact with each other, the second predetermined dose amount is set for a portion of the plotting pattern that includes a portion of a profile of the first n-fold design pattern at which the first n-fold design pattern is in contact with the second n-fold design pattern.

43. A substrate working method according to claim 35, wherein, in order to inspect the pattern formed on the substrate, the pattern formed on the substrate and the design pattern are compared with each other.

44. A substrate working method according to claim 35, wherein the substrate is a mask blank.

45. A substrate working method according to claim 35, wherein the substrate is a semiconductor substrate or a processing object layer formed on a semiconductor substrate.

46. A substrate working method for working a substrate using an electron beam plotting method based on plotting pattern data, comprising:

plotting a pattern on a resist applied to a substrate using an electron beam based on plotting pattern data composed of dose amounts and a plotting pattern produced by a plotting pattern data production method that includes the steps of:

producing an n-fold design pattern by multiplying a design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtaining a plotting pattern by converting the n-fold design pattern such that profiles of the n-fold design pattern coincide with lines of the plotting grid adjacent to the profiles of the n-fold design pattern;

setting evaluation points $E_i$ and $E_j$ at predetermined positions of the profiles of the n-fold design pattern and solving a stored energy balance equation set up at each of the evaluation points to determine a first predetermined dose amount at each portion of the plotting pattern that includes any profile of the n-fold design pattern and setting a second predetermined dose amount for each portion of the plotting pattern that does not include any profile of the n-fold design pattern; and developing the plotted resist to produce an etching mask and patterning the substrate using the etching mask.

47. A plotting pattern data production method according to claim 46, wherein the entire n-fold design pattern is partitioned into predetermined regions, and where positions of the evaluation points $E_i$ where i=1, 2, ..., m are represented by $EP_i$, dose amounts at those portions of the plotting pattern which include the profiles in which the evaluation points $E_i$ of the n-fold design pattern are included and represented by $D_j$, where j=1, 2, ..., m, and the portions of the plotting pattern are represented by $AP_j$, the second predetermined dose amount is represented by $D_0$ and the portion of the plotting pattern which does not include any profile of the n-fold design pattern is represented by $AP_0$ dose amounts at eight regions around a region that includes the n-fold design pattern in which the evaluation points $E_i$ are included are represented by $d_k$ where k=1, 2, ..., 8 and the eight regions are represented by $ap_k$, a stored energy threshold value is represented by $E_{th}$, an energy intensity distribution function is represented by f(r), and a back scattering coefficient of the energy intensity distribution function is represented by η and a forward scattering radius of the energy intensity distribution function is represented by $β_f$ while a back scattering radius of the energy intensity distribution function is represented by $β_b$, the stored energy balance equation is given by the following expression (1):

$$\sum_{j=1}^{m} D_j \int_{r \in AP_j} f(r - EP_i) dr + \\ D_0 \int_{r \in AP_0} f(r - EP_i) dr + \sum_{k=1}^{8} d_k \int_{r \in ap_k} f(r - EP_i) dr = E_{th} \\ \text{where } f(r) = \frac{1}{\pi(1+\eta)} \left[ \frac{1}{\beta_f^2} \exp - \frac{r^2}{\beta_f^2} + \frac{\eta}{\beta_b^2} \exp - \frac{r^2}{\beta_b^2} \right]. \tag{1}$$

48. A substrate working method according to claim 46, wherein the n-fold design pattern is converted so that a size of the plotting pattern may be equal to or larger than the n-fold design pattern.

49. A substrate working method according to claim 46, wherein the n-fold design pattern is converted so that a size of the plotting pattern may be equal to or smaller than the n-fold design pattern.

50. A substrate working method according to claim 46, wherein when a first n-fold design pattern and a second n-fold design pattern are in contact with each other, the second predetermined dose amount is set for a portion of the plotting pattern that includes a portion of a profile of the first n-fold design pattern at which the first n-fold design pattern is in contact with the second n-fold design pattern.

51. A substrate working method according to claim 46, wherein, in order to inspect the pattern formed on the substrate, the pattern formed on the substrate and the design pattern are compared with each other.

52. A substrate working method according to claim 46, wherein the substrate is a mask blank.

53. A substrate working method according to claim 46, wherein the substrate is a semiconductor substrate or a processing object layer formed on a semiconductor substrate.

54. An electron beam plotting apparatus comprising:

a design pattern data storage configured for storing data of a design pattern;

a design pattern data divider configured for dividing the data of a design pattern into data of a predetermined size;

a first storage configured for storing the divided data of the design pattern;

a plotting pattern data generator configured for producing plotting pattern data based on the divided data of the design pattern stored in said first storage;

a second storage configured for storing the produced plotting pattern data;

an electron beam plotter;

said plotting pattern data generator being operable, based on the divided data of the design pattern, to;

produce an n-fold design pattern by multiplying the design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtain a plotting pattern by converting the n-fold design pattern such that profiles of the n-fold design pattern coincide with lines of the plotting grid adjacent to the profiles of the n-fold design pattern; and set a first predetermined dose amount for each portion of the plotting pattern that includes any profile of the n-fold design pattern in accordance with a ratio in area of the n-fold design pattern which occupies the plotting pattern and set a second predetermined dose amount for each portion of the plotting pattern that does not include any profile of the n-fold design pattern.

55. An electron beam plotting apparatus according to claim 54, wherein said plotting pattern data production means converts the n-fold design pattern so that a size of the plotting pattern may be equal to or larger than the n-fold design pattern.

56. An electron beam plotting apparatus according to claim 55, wherein said plotting pattern data generator sets the first predetermined dose amount equal to or smaller than the second predetermined dose amount.

57. An electron beam plotting apparatus according to claim 56, wherein said plotting pattern data generator sets the first predetermined dose amount among different stages in accordance with a ratio in area of the n-fold design pattern which occupies the plotting grid.

58. An electron beam plotting apparatus according to claim 54, wherein said plotting pattern data generator converts the n-fold design pattern so that a size of the plotting pattern may be equal to or smaller than the n-fold design pattern.

59. An electron beam plotting apparatus according to claim 58, wherein said plotting pattern data generator sets the first predetermined dose amount equal to or larger than the second predetermined dose amount.

60. An electron beam plotting apparatus according to claim 59, wherein said plotting pattern data generator sets the first predetermined dose amount among different stages in accordance with a ratio in area of the n-fold design pattern which occupies the plotting grid.

61. An electron beam plotting apparatus according to claim 54, wherein said plotting pattern data generator sets when a first n-fold design pattern and a second n-fold design pattern are in contact with each other, the second predetermined dose amount for a portion of the plotting pattern that includes a portion of a profile of the first n-fold design pattern at which the first n-fold design pattern is in contact with the second n-fold design pattern.

62. An electron beam plotting apparatus comprising:

a design pattern data storage configured for storing data of a design pattern;

a design pattern data divider configured for dividing the data of a design pattern into data of a predetermined size;

a first storage configured for storing the divided data of the design pattern;

a plotting pattern data generator configured for producing plotting pattern data based on the divided data of the design pattern stored in said first storage;

a second storage configured for storing the produced plotting pattern data;

an electron beam plotter;

said plotting pattern data generator being operable, based on the divided data of the design pattern, to:

produce an n-fold design pattern by multiplying the design pattern by n times a minimum design pattern unit length, wherein a minimum plotting length between lines of a plotting grid used in plotting with an electron beam is N times the minimum design pattern unit length, with N being larger than 1 and n being larger than 1 but less than N;

obtain a plotting pattern by converting convert the n-fold design pattern such that profiles of the n-fold design pattern coincide with lines of the plotting grid adjacent to the profiles of the n-fold design pattern; and set evaluation points $E_i$ and $E_j$ at predetermined positions of the profiles of the n-fold design pattern and solve a stored energy balance equation set up at each of the evaluation points to determine a first predetermined dose amount at each portion of the plotting pattern that includes any profile of the n-fold design pattern and set a second predetermined dose amount for each portion of the plotting pattern that does not include any profile of the n-fold design pattern.

63. An electron beam plotting apparatus according to claim 62, wherein said plotting pattern data generator partitions the entire n-fold design pattern into predetermined regions, and where positions of the evaluation points $E_i$ where i=1, 2, . . . , m are represented by $EP_i$, dose amounts at those portions of the plotting pattern which include the profiles in which the evaluation points $E_i$ of the n-fold design pattern are included and represented by $D_j$, where j=1, 2, . . . , m, and the portions of the plotting pattern are represented by $AP_j$, the second predetermined dose amount is represented by $D_0$ and the portion of the plotting pattern which does not include any profile of the n-fold design pattern is represented by $AP_0$, dose amounts at eight regions around a region that includes the n-fold design pattern in which the evaluation points $E_i$ are included are represented by $d_k$ where k=1, 2, . . . , 8 and the eight regions are represented by $ap_k$, a stored energy threshold value is represented by $E_{th}$, an energy intensity distribution function is represented by f(r), and a back scattering coefficient of the energy intensity distribution function is represented by η and a forward scattering radius of the energy intensity distribution function is represented by $\beta_f$ while a back scattering radius of the energy intensity distribution function is represented by $\beta_b$, the stored energy balance equation is given by the following expression (1):

$$\sum_{j=1}^{m} D_j \int_{r \in AP_j} f(r - EP_i) dr +$$

$$D_0 \int_{r \in AP_0} f(r - EP_i) dr + \sum_{k=1}^{8} d_k \int_{r \in ap_k} f(r - EP_i) dr = E_{th}$$

$$\text{where } f(r) = \frac{1}{\pi(1+\eta)} \left[ \frac{1}{\beta_f^2} \exp - \frac{r^2}{\beta_f^2} + \frac{\eta}{\beta_b^2} \exp - \frac{r^2}{\beta_b^2} \right].$$

64. An electron beam plotting apparatus according to claim 62, wherein said plotting pattern data generator converts the n-fold design pattern so that a size of the plotting pattern may be equal to or larger than the n-fold design pattern.

65. An electron beam plotting apparatus according to claim 62, wherein said plotting pattern data generator converts the n-fold design pattern so that a size of the plotting pattern may be equal to or smaller than the n-fold design pattern.

66. An electron beam plotting apparatus according to claim 62, wherein said plotting pattern data generator sets, when a first n-fold design pattern and a second n-fold design pattern are in contact with each other, the second predetermined dose amount for a portion of the plotting pattern that includes a portion of a profile of the first n-fold design pattern at which the first n-fold design pattern is in contact with the second n-fold design pattern.

* * * * *